United States Patent
Naganawa et al.

(10) Patent No.: US 9,054,244 B2
(45) Date of Patent: Jun. 9, 2015

(54) IRREGULAR-SURFACE FORMING METHOD USING PLASMA-ETCHING PROCESS, AND ELECTRODE MEMBER

(75) Inventors: Satoshi Naganawa, Tokyo (JP); Takeshi Kondo, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 214 days.

(21) Appl. No.: 13/634,296

(22) PCT Filed: Jan. 5, 2011

(86) PCT No.: PCT/JP2011/050020
§ 371 (c)(1),
(2), (4) Date: Sep. 12, 2012

(87) PCT Pub. No.: WO2011/118238
PCT Pub. Date: Sep. 29, 2011

(65) Prior Publication Data
US 2013/0008697 A1      Jan. 10, 2013

(30) Foreign Application Priority Data
Mar. 23, 2010   (JP) .................................. 2010-066514

(51) Int. Cl.
*B44C 1/22*         (2006.01)
*H01L 31/0236*   (2006.01)
(Continued)

(52) U.S. Cl.
CPC ....... *H01L 31/02366* (2013.01); *H01L 51/0037* (2013.01); *H01L 51/441* (2013.01); *H01L 51/447* (2013.01); *C01G 19/02* (2013.01); *C01G 21/02* (2013.01); *C01G 31/02* (2013.01);
(Continued)

(58) Field of Classification Search
CPC . H01L 31/02366; H01L 51/447; C01G 21/02
USPC ...................................................... 216/51, 13
See application file for complete search history.

(56) References Cited

U.S. PATENT DOCUMENTS 4,657,632 A       4/1987   Holtzman et al.
2009/0220561 A1*  9/2009   Jin et al. ........................ 424/423
(Continued)

FOREIGN PATENT DOCUMENTS

EP   0 308 902    3/1989
JP   64-81228     3/1989
(Continued)

OTHER PUBLICATIONS

European Search Report—Apr. 24, 2014.

*Primary Examiner* — Duy Deo
*Assistant Examiner* — Mahmoud Dahimene
(74) *Attorney, Agent, or Firm* — Gerald E. Hespos; Michael J. Porco; Matthew T. Hespos

(57) ABSTRACT

A method is provided forming a predetermined irregular-surface pattern on a substrate. The method includes carrying out a plasma-etching process using a partly oxidized metal salt film having fine irregular-surface as a resist. In a first step, a metal salt film is formed on the substrate by coating a liquid material containing a metal salt. In a second step, a fine irregular-surface is formed on the metal salt film, and the metal salt film was converted into the resist by the partial oxidation. In a third step, a predetermined irregular-surface is formed on the substrate by carrying out the plasma-etching process to the substrate with the resist.

9 Claims, 12 Drawing Sheets

(51) Int. Cl.
  *H01L 51/44* (2006.01)
  *C01G 19/02* (2006.01)
  *C01G 21/02* (2006.01)
  *C01G 31/02* (2006.01)
  *C01G 45/02* (2006.01)
  *C01G 53/04* (2006.01)
  *C01G 3/02* (2006.01)
  *C01G 5/00* (2006.01)
  *C01G 9/02* (2006.01)
  *C01G 11/00* (2006.01)
  *C01G 13/02* (2006.01)
  *C01G 15/00* (2006.01)
  *H01L 51/00* (2006.01)

(52) U.S. Cl.
  CPC ............... *C01G45/02* (2013.01); *C01G 53/04* (2013.01); *C01G 3/02* (2013.01); *C01G 5/00* (2013.01); *C01G 9/02* (2013.01); *C01G 11/00* (2013.01); *C01G 13/02* (2013.01); *C01G 15/00* (2013.01); *C01P 2002/85* (2013.01); *C01P 2004/03* (2013.01); *C01P 2006/40* (2013.01); *Y02E 10/549* (2013.01); *H01L 51/0096* (2013.01)

(56) References Cited

U.S. PATENT DOCUMENTS

2011/0101479 A1* 5/2011 Arango et al. .............. 257/431
2012/0034423 A1   2/2012 Naganawa et al.

FOREIGN PATENT DOCUMENTS

| JP | 2-254192 | 10/1990 |
| JP | 2000-327310 | 11/2000 |
| JP | 2005-310387 | 11/2005 |
| JP | 2008-124413 | 5/2008 |
| JP | 2008-177549 | 7/2008 |
| JP | 2009-54763 | 3/2009 |

* cited by examiner

IRREGULAR-SURFACE FORMING METHOD USING PLASMA-ETCHING PROCESS, AND ELECTRODE MEMBER

BACKGROUND OF THE INVENTION

1. Field of the Invention

The present invention relates to an irregular-surface (concave-convex surface) forming method using a plasma-etching process (plasma-etching treatment) and an electrode component. More particularly, the present invention relates to an irregular-surface forming method using a plasma-etching process, which is most suitable for forming an electrode component for electronic devices and the like, and the electrode component obtained by the forming method therefrom.

2. Description of the Related Art

Conventionally, a transparent electrode, that is, a thin film made from the metal oxide (hereinafter, it may be called as a metal oxide film) and formed by a method of a vapor deposition or the like on a glass plate, has been known.

However, a plastic film would substitute for a glass plate in view of the light weight and thinning down.

The following formation methods have been known to form a metal film or a metal oxide film on such a plastic film.

(1) A vapor deposition method such as the vacuum deposition or the sputtering and the like for a metal material and/or a metal oxide material.

(2) A coating method of the solution in which the metal particles or metal oxide particles were dispersed into an organic binder.

However, the production cost for the vapor deposition method (1), is expensive, since a high vacuum condition was necessary, and there are problems in mass productivity and economy.

Also, the coating method of the solution (2) had a problem that the conductivity of the obtained metal film and the like was inferior to that of the metal film and the like which was obtained by the vapor deposition method.

Accordingly, the metal oxide film forming method that the plasma process was carried out after having formed a metal oxide gel on a substrate by the sol-gel method using metal alkoxide and its hydrolyzate has been proposed (e.g., referring to the patent document 1).

More specifically, JP 2000-327310A was directed to the metal oxide film forming method, wherein the metal oxide gel on the substrate was beforehand obtained by changing a metal oxide sol that was obtained from the metal alkoxide or metal salt as a main raw material, and then a predetermined plasma process was carried out to the metal oxide gel to form the metal oxide film.

Meanwhile, in the technical field of an organic solar cell or the like, a transparent electrode substrate for a solar cell equipped with a texturing layer having the irregular-surface, in order to improve light conversion efficiencies, has been disclosed (e.g., referring to JP 2008-177549A).

More specifically, it was the transparent electrode substrate for a solar cell comprising a resin film, a texturing layer having the irregular-surface and a metal oxide layer, wherein the texturing layer having the irregular-surface is obtained by photo-curing of a photo-curable composition.

Furthermore, as an anodizing film, a method of forming a nanostructure pattern directly on a metal film or a metal oxide film has been proposed. Namely, the method for obtaining a porous material with a self-regularly property by using an electrochemical technique, has been proposed (e.g., referring to JP H2-254192A).

More specifically, as shown in FIG. 12A-FIG. 12F, it is the method for obtaining a porous material.

That is, as shown in FIG. 12A, an anodizing film (anodizing film barrier layer 202 and anodizing film porous layer 203) is formed on the surface by anodizing aluminum material which is set to be a matrix 201.

Next, as shown in FIG. 12B, the obtained anodizing film is used as the matrix 201, and a metal 205' which is to be a negative mold of the porous film is filled in a pore of the matrix 201.

Further, as shown in FIG. 12C, the matrix 201 is selectively dissolved, and then, as shown in FIG. 12D, a negative mold 205 of the porous film is obtained by removing the anodizing films 202, 203.

Still further, as shown in FIG. 12E, the other material 206' is filled into the negative mold 205.

Lastly, as shown in FIG. 12F, a porous material 206 which has the same shape as the anodizing film is obtained by selectively dissolving the negative mold 205.

However, according to the formation method disclosed in the patent document 1, the metal oxide sol had to be beforehand changed into the metal oxide gel, when forming the metal film or the metal salt film on the concave-convex structure. Namely, it should be changed before the plasma process was carried out to form the metal oxide film. Therefore, there were problems that not only many producing steps were necessary, but also it was difficult to stably and precisely form the metal oxide film on the concave-convex structure.

Also, according to the formation method disclosed in the patent document 2, there were problems that it was necessary to form the conductive layer comprising a metal film or a metal oxide film on the texturing layer having the concave-convex structure, and in addition that such a metal film or a metal oxide film easily exfoliated from the texturing layer.

Further, according to the formation method of the porous material disclosed in the patent document 3, there were problems that not only many producing steps were necessary, but also it was difficult to stably and precisely produce the porous material comprising the metal oxidize film.

On the other hand, it has been conventionally understood that the plasma-etching process could not be carried out to the substrate as groundwork, through the metal oxide material formed on the substrate.

Therefore, the present inventors have keenly studied the above mentioned problems, and they have discovered that relatively large irregular-surface could be stably and precisely formed on the substrate, by using the metal salt film having the fine irregular-surface which is partially oxidized, as a resist (an etching speed adjustment member), when carrying out the plasma-etching process to a substrate which is appropriate for an electrode component or the like, and they have accomplished to the present invention.

Namely, the objective of the present invention is to provide an irregular-surface forming method using the plasma-etching process to stably and precisely form the irregular-surface having the considerable big surface roughness on the substrate, and to provide an electrode component obtained by the irregular-surface forming method therefrom.

SUMMARY OF THE INVENTION

According to the present invention, a method of forming a predetermined irregular-surface pattern on a substrate is provided, when carrying out a plasma-etching process by using a partly oxidized metal salt film having the irregular-surface as a resist (an etching speed adjustment member), comprising the following first process to the third process, and could solve the problems mentioned above;

(1) in the first process, a metal salt film is formed on the substrate by coating a liquid material containing a metal salt.

(2) in the second process, a fine irregular-surface is formed on the metal salt film, and the metal salt film is converted into the resist by the partial oxidization (partial oxidation).

(3) in the third process, a predetermined irregular-surface is formed on the substrate by carrying out the plasma-etching process to the substrate with the resist.

In this way, the metal substrate film which has the fine irregular-surface (e.g. the center line average surface roughness (Ra) is less than 5 nm) and which is partially oxidized, is formed on the substrate as the resist (an etching speed adjustment member). Then, the plasma-etching process is carried out at the same time to both of the resist and the substrate. Thus, relatively large irregular-surface (e.g. Ra is more than 10 nm) in the order of nanometer could stably and precisely be formed on the substrate.

That is, when the plasma-etching process is carried out to the substrate having the fine irregular-surface and partially oxidized, it is presumed that the plasma-etching speed becomes comparatively faster for a thin part of the metal salt film partially oxidized, and the speed becomes comparatively slower for a thick part of the metal salt film partially oxidized (Hereinafter, this might be called as etching speed adjustment effect.)

Also, it is presumed that such etching speed adjustment effect significantly changes according to the degree of partial oxidization of the metal salt film.

Note that when the liquid material containing a metal salt is coated and dried, while forming the metal salt film with adjusting heating and drying conditions, it is possible to form the irregular-surface and to partially oxidize them at the same time. That is, it is possible to carry out the first process and the second process at the same time in the present invention.

Moreover, according to the present invention, the metal salt film is formed by coating the predetermined liquid material containing the metal salt to the substrate, wherein such liquid material containing the metal salt could be defined as constituted by including at least one of metal salt and metal complex, or both or one of the two, and a predetermined volume of solvent (this is true in the following).

Also, when carrying out the irregular-surface forming method using the plasma-etching process of the present invention, it is preferred to carry out at least one process selected from among the plasma process to the metal salt film, a heat and dry process to the metal salt film and a mechanical press process to the metal salt film, in order to form the irregular-surface on the metal salt film in the second process.

By forming the irregular-surface in this way, it is enabled to more stably and precisely form the resist having the irregular-surface.

Also, when carrying out the irregular-surface forming method using the plasma-etching process of the present invention, it is preferred to carry out the partial oxidization of the meal salt using oxygen as plasma generation gas, or the thermal oxidization process at the temperature of 120 to 300° C. in the second process.

By carrying out the partial oxidization of the metal salt film in this way, it is enabled to more stably and precisely form the resist having predetermined tolerance in the plasma-etching process.

Also, by carrying out the partial oxidization of the metal salt film in this way, it is enabled to exert conductivity on the metal salt film and to obtain a conductive resist.

Also, when carrying out the irregular-surface forming method using the plasma-etching process of the present invention, it is preferred to carry out the plasma process using at least one gas selected from among rare gas, nitrogen, and methane tetrafluoride as plasma generation gas in the third process.

By carrying out the plasma-etching process in this way, it is enabled to more stably and precisely carry out the plasma-etching process both to the resist and the substrate at the same time.

Also, when carrying out the irregular-surface forming method using the plasma-etching process of the present invention, it is preferred that a resin layer comprising an organic material to which the plasma-etching process is carried out, is formed on the surface of the substrate in the first process.

By carrying out the plasma-etching process in this way, it is enabled to use the substrate which is excellent in mechanical strength such as glass, FRP (Fiber Reinforced Plastics) and the like, since the irregular-surface could be easily formed on the resin layer.

Also, when carrying out the irregular-surface forming method using the plasma-etching process of the present invention, it is preferred that the substrate is made of an electrically conducting material, to which the plasma-etching process is carried out.

By carrying out the plasma-etching process in this way, it is enabled to more stably and precisely form the substrate having the irregular-surface and predetermined conductivity as well.

Also, when carrying out the irregular-surface forming method using the plasma-etching process of the present invention, it is preferred to remove the resist stayed behind on the substrate by carrying out the forth process after the third process.

By removing the resist in this way, it is enabled to eliminate negative effects of the resist, with the result that it is enabled to more stably and precisely form the substrate which could be used in a wide range of applications.

Also, another aspect of the present invention is to provide an electrode component having a substrate produced by the irregular-surface forming method using a plasma-etching process, comprising the following first process to third process, and the electrode component is characterized in that the surface resistivity is within the range of $1.0 \times 100$ to $1.0 \times 1010$ $\Omega/\square$.

(1) in the first process, a metal salt film is formed on the substrate by coating a liquid material containing a metal salt.

(2) in the second process, a fine irregular-surface is formed on the metal salt film, and the metal salt film was converted into the resist by the partial oxidization.

(3) in the third process, the predetermined irregular-surface is formed on the substrate by carrying out the plasma-etching process to the substrate with the resist.

When the electrode component is formed by these processes, it is enabled to provide an electrode component which is both simple structure and economical, even if a conductive treatment such as plating or the like to the surface is omitted.

Also, since the electrode has the irregular-surface of a predetermined size, it is enabled to suitably use for an electrode component of electronic devices such as, for example, an electrode component having a low contacting resistivity and a light scattering property.

DETAILED DESCRIPTION OF THE PREFERRED EMBODIMENTS

First Embodiment

The first embodiment is a method of forming an irregular-surface pattern on a substrate, wherein a plasma-etching process is carried out using a partly oxidized metal salt film having a fine irregular-surface as a resist. Also, the irregular-surface forming method using the plasma-etching process comprises the following first process to the third process;

(1) in the first process, a metal salt film is formed on the substrate by coating a liquid material containing a metal salt.

(2) in the second process, a fine irregular-surface is formed on the metal salt film, and the metal salt film is converted into a resist by the partial oxidization.

(3) in the third process, the irregular-surface is formed on the substrate by carrying out the plasma-etching process to the substrate with the resist.

The embodiment of the irregular-surface forming method using the plasma-etching process according to the present invention will be specifically described with referring to FIGS. 1A to 1D in the following.

1. The First Process
(1) Substrate

As for the kinds of the substrate constituent materials, although it is not limited in particular as far as the plasma-etching process is allowed to be carried out to the material, organic resin materials, ceramic materials, metal materials and the like could be used for example.

Here, an organic resin film made from an organic resin material could be preferable as the substrate, because the plasma-etching process is easy to carry out for such substrate.

As for such organic resin film, concretely a resin film made of an organic resin material such as a polyimide resin, a polyamide resin, a polyamide-imide resin, a polyphenylene ether resin, a polyether ketone resin, a polyetheretherketone resin, a polyolefin resin, a polyester resin, a polycarbonate resin, a polysulfone resin, a polyether sulfone resin, a polyphenylene sulfide resin, a polyalylate resin, a polyvinyl alcohol resin, an acrylic resin, an alicyclic structure containing polymer resin, an aromatic polymer resin or the like could be used.

Among these materials, a resin film made of a polyester resin or a polyimide resin could be particularly preferable because of high versatility.

More specifically, a polyethylene telephthalate resin, a polybutylene terephthalate resin, a polyethylene naphthalate resin, a polyalylate resin, or the like, could be used as the polyester resin films.

Also, more specifically as the polyamide resin films, an all aromatic polyamide resin, a nylon 6 resin, a nylon 66 resin or a nylon copolymer resin or the like could be used.

Figure 1A:
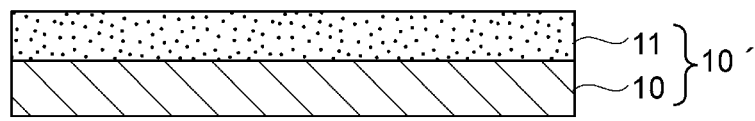
FIGS. 1A-1E are figures offering to describe the irregular-surface forming method using a plasma-etching process of the present invention.

Note that as shown in FIG. 1A, the substrate could be used as provided with the resin layer 11 containing the above mentioned organic resin film or material to which the plasma-etching process is allowed to be carried out, in order to carry out the plasma-etching process, since the base 10, for example, a glass plate or the like, is generally difficult to carry out the plasma-etching process. Moreover, on the above mentioned organic resin film, the substrate could be further provided with the resin layer containing the above mentioned organic resin film or a material to which the plasma-etching process is allowed to be carried out.

As for a material for forming such resin film 11, it is not limited as far as the plasma-etching process could be carried out to the material, but such organic resin as a polyimide resin, a polyamide resin, a polyamide-imide resin, a polyphenylene ether resin, a polyether ketone resin, a polyetheretherketone resin, a polyolefin resin, a polyester resin, a polycarbonate resin, a polysulfone resin, a polyether sulfone resin, a polyphenylene sulfide resin, a polyalylate resin, polyvinyl alcohol resin, an acrylic resin, an alicyclic structure containing polymer resin, an aromatic polymer resin or the like could be used for example.

Also when such an organic resin film or a resin layer is provided on the base 10 such as a glass plate or the like, a well-known layer forming method, coating method or the like could be used.

In these cases, it is preferred that the thickness of the organic resin film or the resin layer is within the range of 0.1 to 1500 μm. This is because if the thickness is over 1500 μm, there are cases that it takes an excessively long time to carry out the plasma-etching process, that the handling ability extremely decreased, that its usefulness becomes excessively limited and that it becomes economically disadvantageous. On the other hand, if the thickness is below 0.1 μm, there are cases that its functional strength becomes deteriorated and that it becomes difficult to stably form the uniform thickness.

Therefore, it is more preferred that the thickness of the resin layer or the like formed on the base 10 such as the glass plate or the like, is set to be a value within the range of 0.5 to 1000 μm, and much more preferred that the thickness is set to be a value within the range of 1 to 500 μm.

On the other hand, it is also preferred that an organic resin layer composed of a conductive polymer material is provided as a substrate or a part of the substrate.

This is because by comprising a conductive polymer material, it enables to stably and precisely utilize for predetermined applications necessitating conductivity, without carrying out a predetermined conductive treatment.

Also, as for a conductive polymer material, the polymer material having conductivity by π-electron coupling is preferred. As concrete examples, a polyaniline and its derivative, a polythiophene and its derivative, a polypyrrole and its derivative, a polyquinoxaline and its derivative could be used. Among these, a polyaniline and its derivative, a polythiophene polymer and its derivative, and polypyrrole polymer and its derivative are more preferred based on the good conductivity.

Furthermore, as for a polythiophene and its derivative, for example, poly 3-methyl thiophene, poly 3-ethyl thiophene, poly 3-methoxy thiophene, poly 3-ethoxy thiophene, poly 3,4-ethylenedioxy thiophene (PEDOT), poly (3,4-ethylene oxide thiophene) a mixture of polystyrene sulfonic acid ion as for dopant (hereinafter, these may be called as PEDOT:PSS) could be used.

Also as for the substrate thickness, although it is not limited in particular, it is generally preferred that the thickness is set to be a value within the range of 0.5 to 2000 μm.

This is because there are cases that its functional strength and the handling ability extremely decreased, and that it becomes difficult to stably form a metal oxide layer with the uniform thickness, if the thickness is below 0.5 μm.

On the other hand, if the thickness is over 2000 μm, there are cases that it takes an excessively long time to carry out a plasma-etching process, the handling ability extremely decreased, its usefulness becomes excessively limited and it becomes economically disadvantageous.

Therefore, it is preferred that the thickness of the substrate is set to be a value within the range of 1 to 1000 μm, more preferred that the thickness is set to be a value within the range of 5 to 500 μm and much more preferred that the thickness is set to be a value within the range of 10 to 200 μm.

Also, the metal oxide film could be directly formed on the substrate, or after carrying out a predetermined surface treatment to the substrate, the metal oxide film could be indirectly formed on the treated substrate.

As for such surface treatment, a primer treatment, a corona treatment or a flame treatment could be carried out, and a primer treatment is particularly preferable.

This is because by using such the substrate on which a primer layer is formed, its adhesion of the resist comprising a metal oxide film to the substrate could be further improved.

Also, as for a material for forming such a primer layer, cellulose ester (e.g., cellulose acetate, cellulose acetate propionate, cellulose acetate butyrate, cellulose nitrate and combinations thereof), polyacrylic, polyurethane, polyvinyl alcohol, polyvinyl ester, polyvinyl acetal, polyvinyl ether, polyvinyl ketone, polyvinyl carbazole, polyvinyl butyral and combinations thereof could be used.

Note that the thickness of a primer layer is not limited in particular, but it is generally preferred that the thickness is set to be a value within the range of 0.05 μm and 10 μm.

(2) Liquid Material Containing a Metal Salt

Figure 1B:
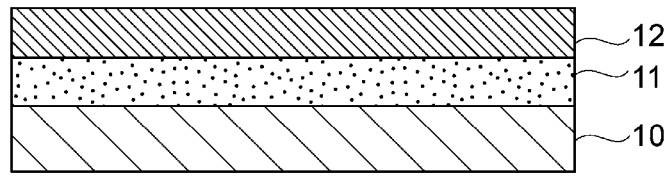

As shown in FIG. 1B, the metal salt film 12 as a resist is formed by coating the predetermined liquid material containing a metal salt to the substrate. According to the present invention, such liquid material containing the metal salt includes both the metal salt and the metal complex or either, and a predetermined amount of a solvent.

Also, it is preferred that a predetermined amount of a dopant precursor is added to the liquid material containing the metal salt, because the surface resistivity (surface specific resistance) could be controlled within a predetermined range.

The metal salt, the metal complex, a dopant precursor or the like will be specifically described in detail as following.

(2)-1 Metal Salt

Also, as for a kind of the metal salt, which is not limited in particular, for example, inorganic salts such as halogenide, a nitrate salt, sulfate or the like, and organic salt such as organic phosphate, carboxylate, organic acid salt, or the like could be used.

Here, chloride or bromide could be used as halogenide, and chloride is preferable.

Also, as for carboxylate, acrylic acid, methacrylic acid, acetic acid, salicylic acid, formic acid, oxalic acid, propionic acid, lactic acid, trifluoroacetic acid, fumaric acid, itaconic acid, maleic acid, or the like could be used.

As a kind of metal to form a metal salt, among such a metal as platinum (Pt), gold (Au) silver (Ag), copper (Cu), aluminum (Al), zinc (Zn), indium (In), tin (Sn), antimony (Sb), gallium (Ga), titanium (Ti), mercury (Hg), manganese (Mn), nickel (Ni), molybdenum (Mo), germanium (Ge), lead (Pb), cadmium (Cd), bismuth (Bi), thallium (Tl) or the like, only one kind alone or a combination of two kinds or more could be used.

Therefore, as the metal salt, copper acetate, cadmium acetate, zinc acetate, mercury acetate, lead acetate, gallium acetate, indium acetate, thallium acetate, titanium acetate, manganese acetate, nickel acetate, molybdenum acetate, palladium acetate, silver acetate, or the like could be used.

Particularly, the metal salt including at least one such metal selected from among zinc (Zn), indium (In) and tin (Sn) is preferable, since a resist comprising the metal salt film having transparency could be obtained.

Also, it is preferred that the metal salt includes zinc (Zn) or indium (In), since the metal salt film having a lower surface resistivity could be obtained, even if the resist of the present invention partially stays behind.

(2)-2 Metal Complex

Also, as for the metal complex, a compound having the metal or metal ion at the center of the molecular, which consists of so called ligands with unshared electron pairs surrounding the metal or metal ion, could be appropriately used.

More specifically, a compound could be used, which includes monodentate ligand such as pyridine, triphenylphosphine, a nitric acid ion, a halide ion, ammonia, or the like, bidentate ligand such as ethylenediamine, bipyridine, acetylacetonate, phenanthroline, or the like, and tridentate ligand such as terpyridine, ethylenediaminetetraacetic acid, or the like.

As a kind of metal to form a metal complex, among such a metal as iron (Fe), cobalt (Co), nickel (Ni), copper (Cu), zinc (Zn), indium (In), or titanium (Ti) or the like, only one kind alone or a combination of two kinds or more could be used.

Also, as a preferred metal complex, the metal complex containing the above metal could be used. That is, among zinc acetylacetonate, indium (III) acetylacetonate, titanium acetylacetonate, cadmium acetylacetonate, mercury acetylacetonate, lead acetylacetonate, gallium acetylacetonate, thallium acetylacetonate, manganese acetylacetonate, nickel acetylacetonate, molybdenum acetylacetonate, palladium acetylacetonate, silver acetylacetonate or the like, only one kind alone or a combination of two kinds or more could be used.

(2)-3 Dopant Precursor

Also, as the liquid material containing the metal salt, a predetermined amount of a dopant precursor is preferable to mix with the liquid material.

This is because by adding the dopant precursor to the liquid material, the surface resistivity could be controlled within a predetermined range, even if the resist of the present invention partially stays behind.

Here as for dopant, a compound including such metal as gallium (Ga), aluminum (Al), silicon (Si), tin (Sn), scandium (Sc), or the like, could be used. It is preferred that among gallium (III) acetylacetonate, aluminum acetylacetonate, tin (II) acetylacetonate or the like, only one kind or a combination of two kinds or more could be used.

Also, as for an amount of the added dopant precursor, it is preferred that the such amount of a metal which is included in the dopant precursor is set to be a value within the range of 1 to 10 mol %, against the total amount of the metal which is included in the metal salt or metal complex and the metal which is included in the dopant precursor.

This is because when the amount of the added dopant precursor is below 1 mol %, there may be cases that an effect of addition is not exerted or that a surface resistivity of the obtained substrate varies greatly.

On the other hand, if the amount of the added dopant precursor is over 10 mol %, there may be cases that an effect of addition does not improve, or conversely that the effect rather decreases.

Consequently, it is more preferred that the amount of the added dopant precursor is set to be a value within the range of 2 to 8 mol %, and much more preferred that the amount is set to be a value within the range of 3 to 7 mol %.

(2)-4 Solvent

Also, as for a solvent for constituting the liquid material containing the metal salt, for example, a nitrile compound or its derivative such as acetonitrile, propionitrile, or the like, alcohol such as methanol or ethanol, acetone, N, N-dimethylformamide, dimethyl sulfoxide, water, or the like, could be used.

(2)-5 Concentration

Also, as for the concentration of a liquid material containing the metal salt, it is preferred that it is set to be a value within the range of 0.01 to 15 mol/L (mol/litter).

This is because if the concentration of the metal salt or the metal complex is below 0.01 mol/L, there are cases that pinholes are easily formed in the obtained metal salt film, resulting in that there are cases that the resist function decreases.

On the other hand, if the concentration of the metal salt or the metal complex is over 15 mol/L, there are cases that the metal salt or the metal complex educes in the liquid material, and the obtained metal salt film as the resist likely to form ununiformly.

Thus, it is more preferred that the concentration of the metal salt or the metal complex is set to be a value within the range of 0.02 to 10 mol/L, and much more preferred that the concentration is set to be a value within the range of 0.03 to 5 mol/L.

(2)-6 Viscosity

It is preferred that a viscosity of a liquid material containing the metal salt (a measurement temperature is 25° C.) is set to be a value within the range of 0.1 to 5000 mPa·sec, and more preferred that the viscosity is set to be a value within the range of 1 to 1000 mPa·sec.

This is because when the viscosity of the liquid material containing the metal salt is within such range, it may be easy to form the metal salt film with the uniform thickness.

(3) Coating Method

As coating method of the liquid material containing the metal salt on the substrate a well-known coating method would be applicable.

More specifically, a dipping method, a spin coat method, a knife coat method, a bar coat method, a blade coat method, a squeeze coat method, a reverse roll coat method, a gravure roll coat method, a curtain coat method, a spray coat method, a die coat method, a ink-jet method, or the like, could be used.

Particularly, in order to coat the liquid material containing the metal salt with the more uniform thickness, it is preferred to use a spin coat method or a gravure roll coat method or the like.

Also, since the liquid material containing the metal salt is normally water-soluble, an ink-jet method is preferable in order to quickly and precisely form a predetermined pattern while coating.

Furthermore, it is preferred that the thickness of the metal salt film after drying is set to be a value within the range of 10 to 200 nm as mentioned later.

This is because when the thickness is within such range, it may be easy to obtain the predetermined resist effect.

More specifically, this is because when the resist thickness is below 10 nm, the time for eliminating the resist comes to short in the plasma-etching process in the third process, with the result that there are cases that it is difficult to obtain the substrate having predetermined irregular-surface.

On the other hand, if the resist thickness is over 200 nm, the time for plasma-etching of the resist itself comes to excessively long. As a result that there are cases that the substrate suffers thermal damage and that it is difficult to obtain economically the substrate having predetermined irregular-surface.

Thus, it is more preferred that the resist thickness is set to be a value within the range of 20 to 150 nm, and much more preferred that the resist thickness is set to be a value within the range of 30 nm to 100 nm.

2. The Second Process-1 (Irregular-Surface Forming Process)

Figure 1C:
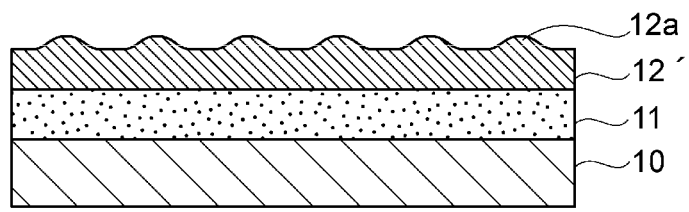

As exemplified in FIG. 1C, the second process is the process wherein fine irregular-surface 12a are formed on the metal salt film 12, and then the metal salt film is converted into the resist 12" (an etching speed adjustment member) by the partial oxidization with the irregular-surface 12a.

That is, in order to stably and precisely form the predetermined fine irregular-surface, it is preferred to carry out at least one process selected from among a plasma-etching process, drying process of a liquid material containing the metal salt and a mechanical pressure process.

The plasma-etching process, drying process of the liquid material containing the metal salt and a mechanical pressure process which are carried out to form the irregular-surface in the second process, will be specifically described as following.

(1) Plasma Process

When the plasma process (plasma treatment) is carried out to form the predetermined fine irregular-surface, it is preferred to use both of rare gas and nitrogen or either, as the plasma generation gas.

This is because the irregular-surface with a predetermined shape and with a predetermined height could be formed on the metal salt film by using such gas. As a result, the metal salt film having the irregular-surface with a predetermined shape and with a predetermined height could be precisely obtained.

That is, although a plasma-etching process is comparatively easy to carry out to the metal salt film because the metal salt film is before an oxidization process, brush shape irregular-surface, which is flat on the whole, however, there are a lot of subsidences, could be formed on the metal salt film by using such specific gas, for example, as krypton gas or nitrogen gas.

Also, by changing a kind of plasma generation gas, for example, to argon gas or helium gas, as a condition of the plasma process, the irregular-surface with a mountain shape could be formed on the metal salt film.

Also, it is preferred that a temperature of the plasma process is set to be a value within the range of 20 to 100° C.

This is because when the temperature is below 20° C., it takes an excessively long time for the plasma process, with the result that there are cases that it would be difficult to efficiently form irregular-surface on the metal salt film.

On the other hand, when the temperature is over 100° C., there are cases that it is difficult to stably form the irregular-surface on the metal salt film, that economical efficiency decreases, and that the substrate is occasionally deformed by heat.

Therefore, it is more preferred that the temperature of the plasma process in the second process is set to be a value within the range of 25 to 90° C., and much more preferred that the temperature is set to be a value within the range of 30 to 80° C.

Note that the temperature of the plasma process is defined as the temperature measured in a plasma chamber.

Also, it is preferred that the plasma pressure is set to be a value within the range of 1 to 500 Pa.

This is because when the plasma pressure is below 1 Pa, there are cases that it takes an excessively long time for forming irregular-surface on the metal salt film.

On the other hand, if the plasma pressure is over 500 Pa, there are cases that it is difficult to stably form the irregular-surface with the predetermined shape on the metal salt film and that economical efficiency decreases.

Therefore, it is more preferred that the plasma pressure is set to be a value within the range of 10 to 300 Pa in the second process, and much more preferred that the pressure is set to be a value within the range of 30 to 100 Pa.

Note that the plasma pressure is defined as the pressure in the plasma chamber.

Here, the effects of the plasma pressure on the center line average surface roughness (Ra) of the metal salt film as the resist in the second process will be described with referring to FIG. 2.

Figure 2:
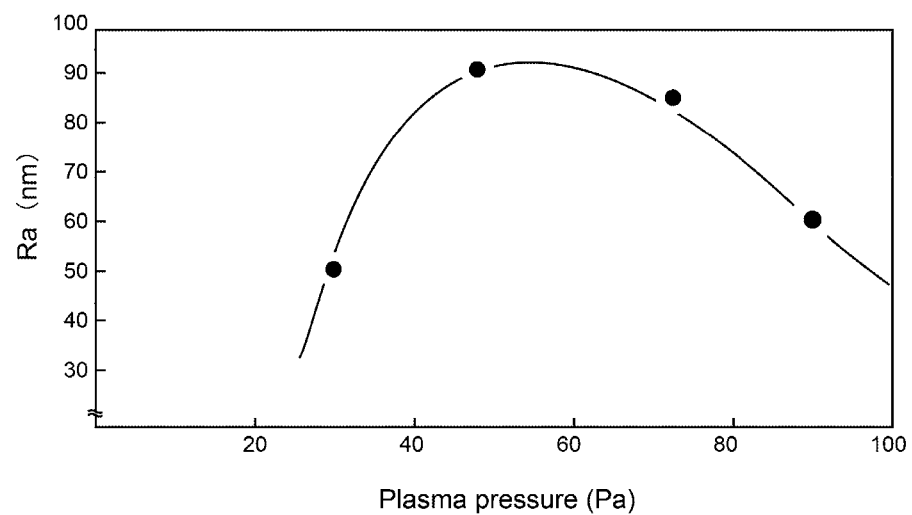
FIG. 2 is a figure offering to describe effect of a plasma pressure in the second process to the center line average surface roughness (Ra) of a metal salt.

The horizontal axis is the plasma pressure (Pa) and the vertical axis is values (nanometer) of the center line average surface roughness (Ra)(nanometer) to the metal salt film in FIG. 2.

Although the center line average surface roughness (Ra) of the metal salt film shows a lower value as below 50 nm when the plasma pressure is about 30 Pa, as the characteristic curve shows, the center line average surface roughness (Ra) shows a comparatively higher value as about 90 nm when the plasma pressure is around 45 Pa.

Further, the center line average surface roughness (Ra) of the metal salt film slightly decreases to about 80 nm when the plasma pressure is about 70 Pa, and then the center line average surface roughness (Ra) of the metal salt film decreases to about 60 nm when the plasma pressure is about 90 Pa.

That is, it is understood that the center line average surface roughness (Ra) of the metal salt film could be precisely obtained within a desired range by adjusting the plasma pressure.

Also, a flow amount of plasma generation gas is appropriately set up in accordance with a kind of metal salt film, a kind of plasma generation gas, or the formed irregular-surface configuration. The favorable flow amount is usually about 5 to 500 ml/min.

Also, it is preferred that the time for the plasma-etching process (plasma process time) is set to be a value within the range of 10 to 600 seconds.

This is because when the plasma process time is below 10 seconds, there are cases that a predetermined shape of irregular-surface is difficult to be stably formed.

On the other hand, if the plasma process time is over 600 seconds, there are cases that the irregular-surface of the obtained predetermined shape is impaired by the plasma, and that the predetermined irregular-surface could be hardly obtained.

Therefore, it is more preferred that the plasma process time is set to be a value within the range of 20 to 500 seconds in the second process, and much more preferred that the plasma process time is set to be a value within the range of 30 to 300 seconds.

(2) Drying Process of the Liquid Material Containing a Metal Salt

Also, in the middle of the drying process, the liquid material containing a metal salt could be changed from a predetermined homogeneous state to a heterogeneous state (e.g., ununiformity in concentration of metal salt). As a result, the metal salt film having the predetermined irregular-surface (texture) could be formed.

To do this, as for the temperature for the drying process of the liquid material containing the metal salt, the value is preferred to be within the range of 80 to 200° C.

This is because when the temperature is below 80° C., there are cases that the film is dried without generating the heterogeneous status, with the result that it is difficult to form the predetermined irregular-surface, although it depends on a kind of metal salt or a kind of metal complex.

On the other hand, if the temperature is over 200° C., there are cases that the lower substrate is deformed by heat or foams are easily formed, and furthermore, there are cases that the formed irregular-surface would be deformed by heat.

Therefore, it is more preferred that the temperature for drying process of the liquid material containing the metal salt is set to be a value within the range of 90 to 150° C., and much more preferred that the temperature is set to be a value within the range of 100 to 120° C.

As for the drying process of the liquid material containing the metal salt, it is preferred that the such drying process time is generally set to be a value within the range of 0.1 to 120 minutes, although it depends on the drying process temperature.

This is because when the drying process time is below 0.1 minute, there are cases that it is difficult to form the predetermined irregular-surface, although it depends on a kind of metal salt or a kind of metal complex.

On the other hand, if the drying process time is over 120 minutes, there are cases that the irregular-surface is deformed.

Therefore, it is more preferred that the drying process time for drying process of the liquid material containing the metal salt is set to be a value within the range of 1 to 60 minutes, and much more preferred that the drying process time is set to be a value within the range of 5 to 30 minutes.

(3) Mechanical Pressure Process

Also, it is preferred to carry out a mechanical pressure process such as a so-called imprint method (including a nanoimprint method) or the like, in order to form the metal salt film having predetermined irregular-surface.

That is, the imprint method is the method developed from the emboss technology, and in which the metal salt film is pressed by a mold (also referred to as stamper or template) having irregular-surface and is mechanically deformed. Namely, the imprint method is a technology in which precisely transcribe a fine pattern in the order of nanometer.

Figure 3A:
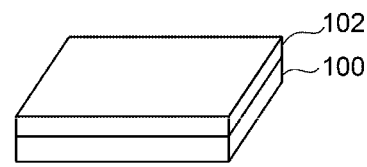
FIGS. 3A-3D are figures offering to describe the imprint method.

More specifically, the liquid material containing the metal salt is coated to a base plate 100, and the metal salt film 102 is formed as shown in FIG. 3A.

Figure 3B:
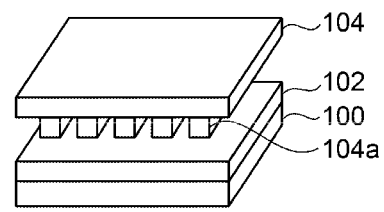

Next, the metal salt film 102 faces to a mold 104 having the predetermined irregular-surface pattern 104a as shown in FIG. 3B, and while keeping the status, the substrate and the mold are pressed with the predetermined pressure.

Figure 3C:
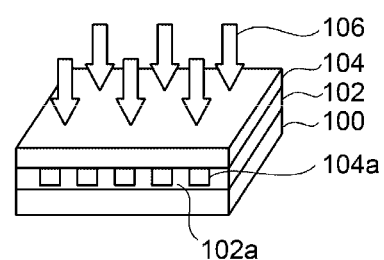

Next, by spraying over with heated air (cooling air) 106, a solidification process (heat process or cooling process) is carried out on the metal salt film 102 as shown in FIG. 3C. Thus, the shape transfer of the mold 104 is carried out to the metal salt film.

Figure 3D:
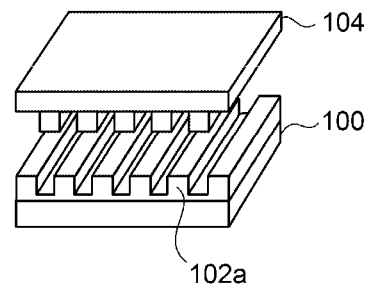

Finally, by separating the mold 104 as shown in FIG. 3D, the metal salt film 102 imprinted by a fine pattern 102a in the nanometer order could be obtained.

Accordingly, if a predetermined mold 104 is manufactured once in the imprint method, it is enabled to repeatedly and easily form the fine pattern 102a in the nanometer order. In this way, the imprint method is a process technology not only economical but also in which environmental safety is considered so as to decrease harmful disposal and waste materials.

(4) Irregular-Surface

When forming the predetermined fine irregular-surface on the metal salt film surface in the second process, it is preferred that the center line average surface roughness (Ra) is set to be a value over 1 nm.

This is because when the center line average surface roughness (Ra) is below 1 nm, there are cases that it becomes difficult to stably and precisely form the irregular-surface having an appropriate size on the substrate as a consequence.

On the other hand, if the center line average surface roughness (Ra) is excessively large, there are cases that the performance of the electrode component would decrease when the obtained substrate is used as an electrode component or the like Therefore, it is more preferred that the center line average surface roughness (Ra) is set to be a value within the range of 1.5 to 50 nm, and much more preferred that the center line average surface roughness (Ra) is set to be a value within the range of 2 to 5 nm.

Note that a value of the center line average surface roughness (Ra) could be measured by using an atomic force microscope (SPA300HV made by SII NanoTechnology Inc.). Further, the center line average surface roughness (Ra) in the present invention is defined as the following formula (1).

[Formula 1]

$$R_a = \frac{1}{S_0} \int_{Y_B}^{Y_T} \int_{X_L}^{X_R} |F(X, Y) - Z_0| dX dY \quad (1)$$

Ra: center line average surface roughness (nm)
F(X,Y): a plate specified by all measurement data (a value Z for (X, Y) coordinates)
$S_0$: an area when it was assumed to be ideally flat from a designated surface ($nm^2$).
$Z_0$: mean values (nm) of Z for designated surface.

On the other hand, as for forming the irregular-surface on the metal salt surface, it is preferred to refer to a ten-point average roughness (Rz) which shows correlation with the center line average surface roughness (Ra)

That is, it is preferred that the ten-point average roughness (Rz) of the metal salt surface is set to be a value over 5 nm, where the ten-point average roughness (Rz) is measured in accordance with JIS B0601-1994.

This is because, when the ten-point average roughness (Rz) is below 5 nm, there are cases that it is difficult to stably and precisely form the irregular-surface having an appropriate size on the substrate as a consequence.

On the other hand, if the ten-point average roughness (Rz) is excessively large, there are cases that the performance of the electrode component would decrease when the obtained substrate is used as an electrode component or the like.

Therefore, it is more preferred that the ten-point average roughness (Rz) is set to be a value within the range of 10 to 100 nm, and much more preferred that the ten-point average roughness (Rz) is set to be a value within the range of 12 to 50 nm.

3. The Second Process-2 (Partial Oxidization Process)

In addition, since the second process includes the process in which the metal salt film is partially oxidized, it is preferred that the plasma process using oxygen as the plasma generation gas or a thermal oxidization process at the predetermined temperature (120-300° C.) is carried out, when the partial oxidization process is carried out.

This is because by carrying out the partial oxidization process to the metal salt film, a certain degree of tolerance for plasma-etching process is generated and it is enabled to use as a resist (an etching speed adjustment member).

That is, in the plasma-etching process to the substrate having partially oxidized metal salt film, it is assumed that a plasma-etching speed of the part where a metal salt film thickness is relatively thin, comparatively becomes faster, and that plasma-etching speed of the part where a metal salt film thickness is relatively thick, comparatively becomes slower, as described above. Also, it is assumed that the effect of the plasma-etching speed adjustment significantly varies according to the degree of the partial oxidization of the metal salt film.

Therefore, by utilizing such plasma-etching speed adjustment effect, the substrate having the predetermined irregular-surface could be stably and precisely formed.

Also, by partially oxidizing the metal salt film in such way, it is enabled that the film has a predetermined conductivity, and that a conductive resist could be formed on the substrate, and thereby resulting in that the substrate could be used as a part of an electrode component.

Note that the partial oxidization here means that the metal salt is not perfectly oxidized, and as a rule of thumb whether or not partial oxidization is carried out, a change of a chemical element quantity (conversion) that is detected, for example, by X-rays photoelectron spectroscopic analysis (XPS) may be used. Thereby, the degree of the partial oxidization could be determined, and could be adjusted.

That is, it is enabled to determine what degree of the metal salt film is partially oxidized, by examining how quantitatively changed a metal attributed to a metal salt or the like in the metal salt film is, or how quantitatively changed a specific chemical element except oxygen is, between before and after the second process (partial oxidization process) by using XPS.

For example, when zinc acetate is used as the metal salt, carbon is regarded as the specific chemical element. Then, when the conversion is high, it shows that the partial oxidization advanced, while when the conversion is low adversely, it shows that the partial oxidation does not advanced too much.

More specifically, in the case of example 1, an element quantity of carbon (A) in the metal salt film measured in XPS before the partial oxidization process, and an element quantity of carbon (B) in the metal salt film after the partial oxidization process are measured. A change of quantity of carbon ($=(A-B)/A\times 100$) is calculated, and, from the value of the change, the partial oxidization status in the metal salt film is determined, and then it could be adjusted.

Thus, it is preferred that the conversion is set to be a value within the range of 10 to 80% in order to have an appropriate partial oxidization status, it is more preferred that the conversion is set to be a value within the range of 15 to 70%, and much more preferred that the conversion is set to be a value within the range of 20 to 60%.

Here, the relationship between the conversion (%) indicating the degree of the partial oxidization of the metal salt film and the center line average surface roughness (Ra) after the plasma-etching process to the partially oxidized metal salt film and substrate, will be described referring to FIG. 4.

Figure 4:
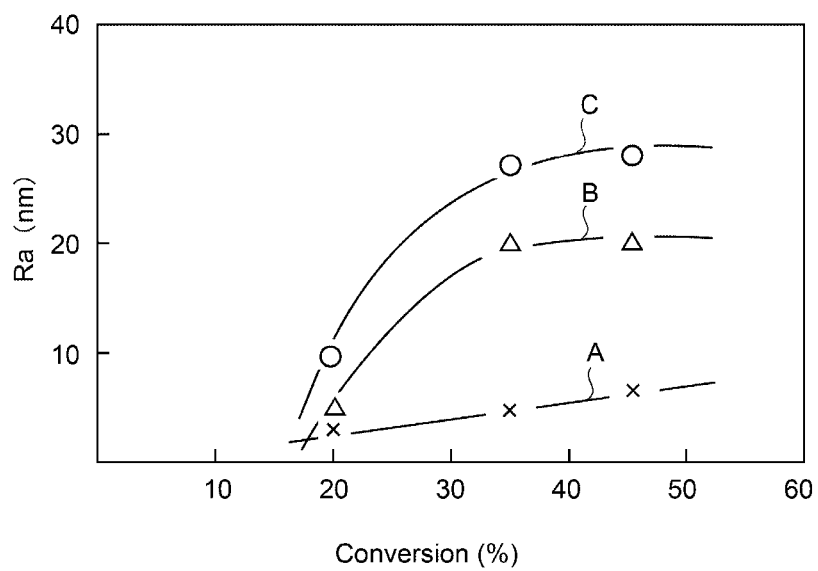
FIG. 4 is a figure offering to describe the relationship between the rate of change (%) for indicating the degree of the partial oxidization of the metal salt film and the center line average surface roughness (Ra) of the substrate after the plasma-etching process.

The horizontal axis is the conversion (%) in the degree of the partial oxidization of the metal salt film and the vertical axis is the value of the center line average surface roughness (Ra) after the plasma-etching process in FIG. 4. Also, measuring data for examples 1 to 9 are plotted on the figure. The characteristic curve A corresponds to the case when the plasma process time is 1 minute, the characteristic curve B corresponds to the case of 3 minutes, and the characteristic curve C corresponds to the case of 5 minutes.

First, from the characteristic curve A, it is understood that when the plasma process time to the partially oxidized metal salt film and substrate is comparatively short (1 minute), if the higher conversion is, that is, the more in the degree of partial oxidization to the salt metal, then the larger the value of the center line average surface roughness (Ra) after the plasma-etching process is in proportionally.

Next, from the characteristic curve B, it is understood that when the plasma process time to the partially oxidized metal salt film and substrate is middle (3 minutes), in the range of the conversion is about 20 to 35%, if the higher conversion is, then the larger the value of the center line average surface roughness (Ra) after the plasma-etching process is. However, in the range of the conversion is over 35% to 45%, the value of the center line average surface roughness (Ra) after the plasma-etching process is approximately constant at around 20 nm, regardless of the rate of change.

Lastly, from the characteristic curve C, it is understood that when the plasma process time to the partially oxidized metal salt film and substrate is comparatively long (5 minutes), in the same way as the characteristic curve B, in the range of the conversion is about 20 to 35%, if the higher conversion is, then the larger the value of the center line average surface roughness (Ra) after the plasma-etching process is. However, in the range of the conversion is over 35% to 45%, the value of the center line average surface roughness (Ra) after the plasma-etching process is approximately constant at around 28 nm, regardless of the rate of change.

Note that same as the relationship between the conversion (%) in the partial oxidization of the metal salt film and the center line average surface roughness (Ra) is shown in FIG. 4, it was confirmed that the relationship between the conversion (%) in the partial oxidization of the metal salt film and the ten-point average roughness (Rz) also had the similar inclination.

Consequently, both by controlling the degree of the oxidization of the metal salt film by means of the conversion and the like in the metal salt film and by controlling the plasma process time, it is enabled to stably and precisely control the size of surface roughness on the substrate (Ra or Rz), according to the facts mentioned above.

Also, when oxygen attributed to the metal salt or the like in the metal salt film is included, it is enabled to determine that the metal salt film becomes the state partially oxidized to the predetermined degree, if an element quantity of carbon in the metal salt film measured in XPS after the partial oxidization process increased, for example, by more than 20%, compared to that before partial oxidization, although it is a rough rule of thumbs.

(1) Plasma Process Using Oxygen

When the plasma oxidization process is carried out, it is preferred to use a predetermined plasma device and to use oxygen, argon, helium, fluorocarbons and the like alone or mixed as a source of plasma.

Also, a compound comprising oxygen such as air, oxygen, water or the like, is appropriately used as the source of oxygen.

Note that as for a plasma device, for example, it is preferred to include at least ion sources, a high frequency electrical power supply, an upper electrode, a bottom electrode and a ground.

Also, on the occasion of the plasma oxidization process, it is preferred that the plasma pressure is set to be a value within the range of $1.0\times 10-3$ to $1.0\times 102$ Pa.

This is because when the plasma pressure is below $1.0\times 10-3$ Pa, the plasma concentration is so low that it takes much time to transform the metal oxide film.

On the other hand, if the plasma pressure is over $1.0\times 102$ Pa, collision among formed plasma ion easily occurs, with the result that a speedup of oxidization is hardly observed.

Therefore, it is more preferred that the plasma pressure is set to be a value within the range of $1.0\times 10-2$ to $5.0\times 101$ Pa.

As for the time for the plasma oxidization process, although it is not limited as far as the predetermined partial oxidization status is obtained, but it is preferred that the such time is set to be a value within the range of 10 to 600 seconds, more preferred that the such time is set to be a value within the range of 30 to 300 seconds, and much more preferred that the such time is set to be a value within the range of 60 to 100 seconds.

Also, a multi-stage plasma oxidization process could be carried out. In that case, conditions of plasma oxidization process are changeable in each stage, or plasma oxidization process is carried out multiple times while keeping the same conditions.

The metal salt film having predetermined irregular-surface as the resist is formed through such processes.

Also, as mentioned above, it is preferred that the center line average surface roughness (Ra) of the metal salt film surface after the partial oxidization process by the plasma oxidization process is a value over 1 nm, it is also preferred that the ten-point average roughness (Rz) is a value over 10 nm.

(2) Thermal Oxidization Process

When the thermal oxidization process is carried out, it is preferred that a temperature of the thermal process is set to be a value within the range of 120 to 300° C.

This is because although it depends on a kind of metal salt or a kind of metal complex, there are cases that it may become difficult to oxidize the metal salt or the metal complex, and to form the metal oxide having conductivity, when the temperature of a thermal oxidization process is below 120° C.

On the other hand, if the temperature of the thermal oxidization process is over 300° C., there are cases that the irregular-surface is deformed by heat, and that the substrate itself is deformed by heat.

Thus, it is more preferred that the temperature of thermal oxidization process is set to be a value within the range of 130 to 220° C., and much more preferred that the temperature is set to be a value within the range of 150 to 180° C.

Also, it is preferred that a time for a thermal oxidization process is set to be a value within the range of 0.1 to 120 minutes.

This is because although it depends on a kind of metal salt or a kind of metal complex, there are cases that it becomes difficult to oxidize the metal salt or the metal complex, and to form the metal oxide having the predetermined conductivity, when the time for the thermal oxidization process is below 0.1 minutes.

On the other hand, if the time for the thermal oxidization process is over 120 minutes, there are cases that irregular-surface is deformed by heat.

Thus, it is more preferred that the time for the thermal oxidization process is set to be a value within the range of 1 to 60 minutes, and much more preferred that the time for the thermal oxidization process is set to be a value within the range of 5 to 30 minutes.

Note that air, oxygen gas, or the like could be used as for an oxygen source. Also, about the embodiment of a thermal oxidization process device, it is not limited in particular, but, for example, a burning oven having an electric heating device or infrared heating device could be used.

Also, as mentioned above, it is preferred that the center line average surface roughness (Ra) of the metal salt film surface after the partial oxidization process by the thermal oxidization process is a value over 1 nm, it is also preferred that the ten-point average roughness (Rz) is a value over 10 nm.

Note that in case the metal salt is partially oxidized in the second process, the partially oxidized metal salt film could be obtained by a drying process to the liquid material containing the metal salt mentioned above.

4. The Third Process

Figure 1D:
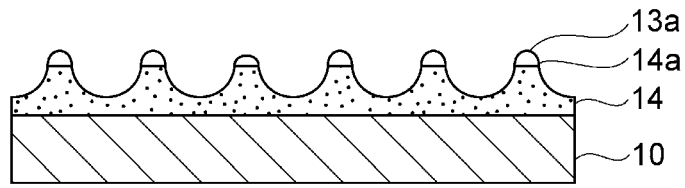

The third process is the process to form fine irregular-surface 14a by carrying out the plasma-etching process to both of the resist comprising the predetermined metal salt film and substrate 10' (resin layer 11) together, as shown in FIG. 1D.

On that occasion, it may possible to thoroughly remove the resist by sufficiently carrying out the plasma-etching process, or it may also possible to stay behind a part of the resist 13a over the fine irregular-surface 14a, as shown in FIG. 1D.

Also, since it is enabled to precisely and quickly carry out the plasma-etching process, it is preferred to carry out the plasma-etching process using the predetermined plasma generation gas.

The plasma-etching process conditions in the third process are described specifically as follows.

(1) Plasma Generation Gas

As for the plasma generation gas for carrying out the plasma-etching process, it is preferred to use at least one of such rare gas selected from among argon, helium, krypton, neon, radon and the like, or such gas as nitrogen or tetrafluoromethane.

This is because by using such generation gas, it is enabled to stably and precisely carry out the plasma-etching process to the resist and the substrate as well.

(2) Plasma Pressure

Also, on the occasion of the plasma-etching process, it is preferred that the plasma pressure is set to be a value within the range of 1 to 1000 Pa.

This is because when the plasma pressure is below 1 Pa, there are cases that it takes an excessively long plasma process time to the substrate including the resist since the plasma concentration is so low.

On the other hand, this is because when the plasma pressure is over 1000 Pa, collisions among formed plasma easily occur, with the result that a speedup of the plasma-etching process is saturated and hardly improves.

Therefore, it is more preferred that the plasma pressure is set to be a value within the range of 10 to 500 Pa, and much more preferred that the pressure is set to be a value within the range of 30 to 100 Pa.

(3) Plasma Process Time

Also, it is preferred that the plasma process time is generally a value within the range of 0.1 to 120 minutes although it could be decided considering the size of surface roughness (Ra, Rz) and applications of the substrate and the like.

This is because when the plasma process time is below 0.1 minute, there are cases that the size of formed surface roughness is excessively small.

On the other hand, if the plasma process time is over 120 minutes, there are cases that collisions among formed plasma easily occur, with the result that a speedup of the plasma-etching process is saturated and hardly improves and that the size of formed surface roughness (Ra, Rz) is also saturated.

Therefore, it is more preferred that the plasma process time is set to be a value within the range of 1 to 60 minutes, and much more preferred that plasma process time is set to be a value within the range of 3 to 30 minutes.

Figure 5A:
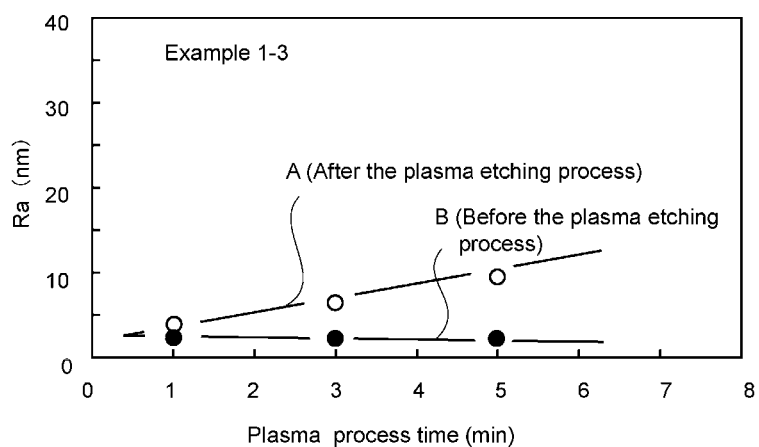
FIGS. 5A-5C are figures offering to describe effect of the plasma process time in the third process to the center line average surface roughness (Ra) of the substrate.
Figure 5B:
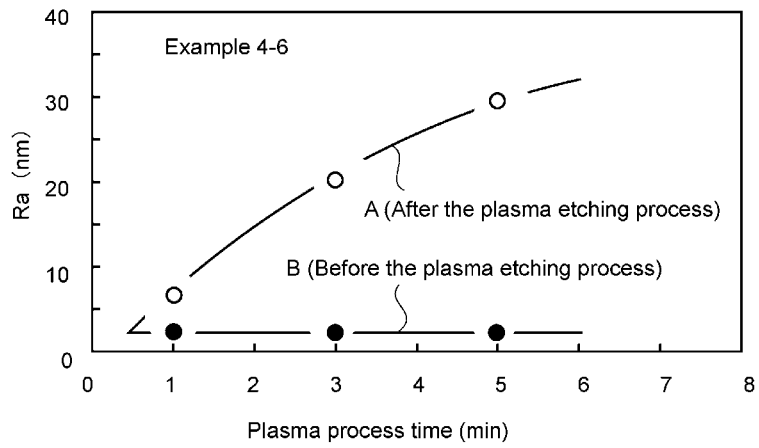
Figure 5C:
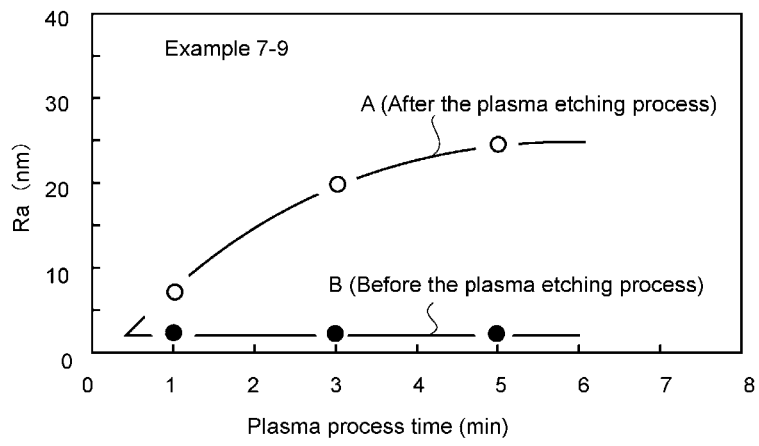

Note that the relationship between the plasma process time of partially oxidized metal salt film and the substrate and the center line average surface roughness (Ra) of the substrate is shown in FIGS. 5A to 5C.

Figure 6A:
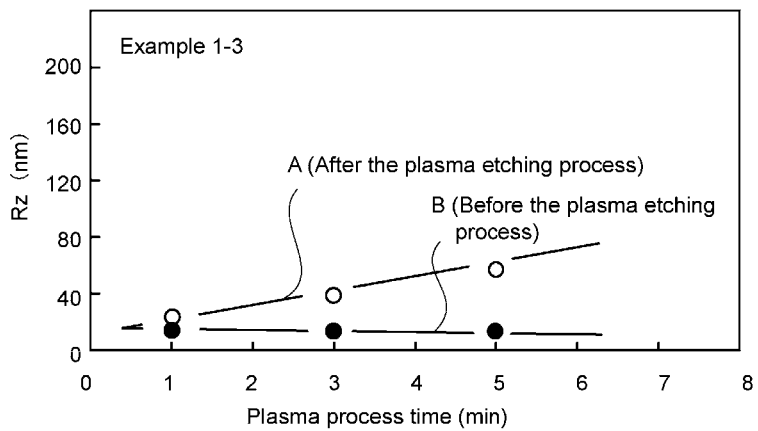
FIGS. 6A-6C are figures offering to describe effect of the plasma process time in the third process to the ten-point average roughness (Rz) of the substrate.
Figure 6B:
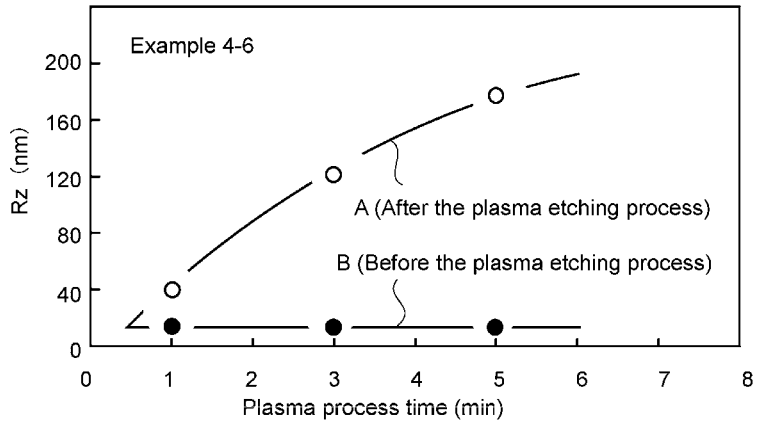
Figure 6C:
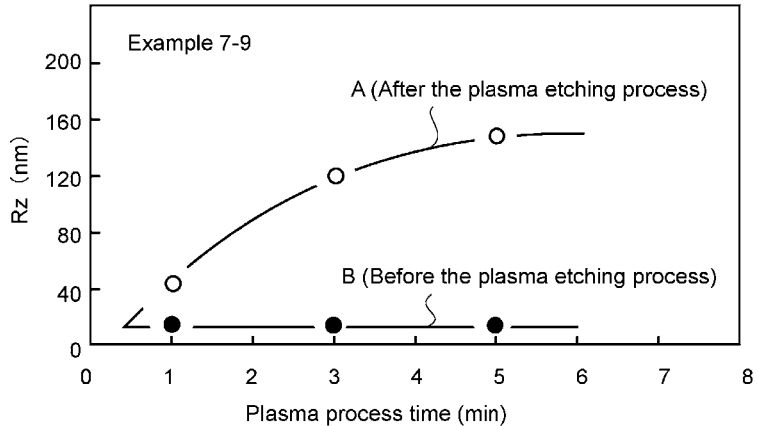

Also the relationship between the plasma process time of partially oxidized metal salt film and the substrate and the center line average surface roughness (Rz) of the substrate is shown in FIGS. 6A to 6C.

In each figure, the characteristic curve A shows the size of the surface roughness (Ra or Rz) after the plasma-etching process, and the characteristic curve B shows the size of the surface roughness (Ra or Rz) which is after the partial oxidization process to the metal salt and before the plasma-etching process.

From the characteristic curve A in the figures, it is understood that the size of the surface roughness (Ra or Rz) is significantly influenced by the plasma process time, and that its size is approximately proportional to the process time.

Conversely, one might say that by exactly controlling the plasma process time within the predetermined range, it is enabled to stably and precisely control the surface roughness (Ra or Rz).

On the other hand, from the characteristic curve B in the figures, it is understood that although the surface roughness before the plasma-etching process is fine and around 2 nm in size, respectively, such fine surface roughness on the substrate become substantially larger by the plasma-etching process, as the characteristic curve A shows.

That is, by using the partially oxidizing metal salt film having the predetermined fine surface roughness as the resist (etching speed adjustment member), it is presumed that effect of an etching speed adjustment member is exerted, and that the substrate having such predetermined surface roughness could be stably and precisely formed.

5. The Forth Process

Figure 1E:
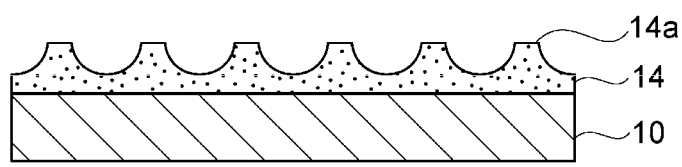

Also, it is preferred that the forth process is provided after the third process and that a resist 13a is removed, which stays behind on the substrate 14 having the irregular-surface 14a, among resists which comprising predetermined metal salt film 12' in the fourth process, as shown in FIG. 1E.

That is, it is preferred that in order to remove the resist 13a staying behind, a removal process is carried out such as water cleaning (washing with warm water or with hot water is included), washing with alcohol, a brush process, an abrasive process, a sanding process, or the like.

It is particularly preferred to remove the resist 13a staying behind on the substrate 14 by washing with water, since the method of washing with water is particularly excellent in environmental safety and is capable of economically disposing the waste.

Note that if metal content detected on the substrate 14, for example, by an element analysis of the substrate 14, using X-rays photoelectron spectroscopic analysis (XPS) is a value less than 1 mol %, it could be judged that the resist 13a staying behind is essentially removed.

Also, as for the removal of the resist 13a staying behind, it is more preferred that the detected metal content is to be a value less than 0.5 mol % and much more preferred that the detected metal content is to be a value less than 0.1 mol %.

6. The Fifth Process

It is also preferred that the fifth process is provided after the third process or the above-mentioned forth process, in order to further stack the metal or metal oxide layer over the obtained substrate or the resist staying behind on the substrate, although this is not shown in figures.

As for the metal to stack, platinum, gold, silver, copper or the like cold be used. Also as for the metal oxide to stack, tin dope indium oxidization (ITO; indium tin oxide), oxidization indium, tin oxide, zinc oxide and the like could be used.

Also as for the forming the metal or metal oxide layer, a well-known formation method, for example, a vacuum deposition method, a sputtering method, an ion plating method, or the like could be available.

7. Other Processes

When a liquid material including halide is used as metal salt, it is possible that hydrogen halide is generated by the plasma oxidization process in the second process.

In that case, it is preferable to carry out a neutralization process and a washing process, or one of such processes, after carrying out the plasma process.

Here, a neutralization process is carried out to immerse the substrate on which the metal salt is formed as the resist, in alkali water solution such as KOH, NaOH, or the like. In case of carrying out this neutralization process, it is preferred to carry out under the condition for the time within 1 second to 10 minutes and at the neutralization temperature within 10 to 40° C.

Also, when washing process is carried out, the substrate on which the metal salt is formed as the resist is washed under the following condition; for example, water could be used as washing material, for the time of 1 to 10 minutes and at the temperature of 10 to 100° C.

Second Embodiment

The second embodiment is a method of forming electrode components 30, 30a, 30b and 30c which are provided with the substrate 14 (occasionally including a resin layer) having the irregular-surface formed by the irregular-surface forming method using the plasma-etching process in the first embodiment, and which are characterized in that the surface resistivity is a value within the range of $1 \times 100$ to $1 \times 10^{10} \Omega/\square$ as shown in FIGS. 7A to 7D.

Note that when the substrate 14 having irregular-surface is made from electrically conducting material, it is enabled to omit an electric conductive treatment such as plating or the like, with the result that it is enabled to provide a simple structured and economical electrode components.

1. Irregular-Surface

The electrode components 30, 30a, 30b and 30c are characterized in that there is the predetermined irregular-surface 14a on the surface of the substrate 14 having the irregular-surface as shown in FIGS. 7A to 7D.

As for right or wrong about the irregular-surface, it could be judged from the value of the center line average surface roughness (Ra) or the ten-point average roughness (Rz), which indicates a kind of surface roughness.

That is, it is preferred that the center line average surface roughness (Ra) of the surface of the substrate is a value over 5 nm, more preferred that Ra is a value within the range of 10 to 500 nm and much more preferred that Ra is a value within the range of 20 to 300 nm.

Furthermore, the ten-point average roughness (Rz) of the surface of the substrate is a value over 10 nm, more preferred that Rz is a value within the range of 20 to 500 nm and much more preferred that Rz is a value within the range of 50 to 300 nm.

Figure 7A:
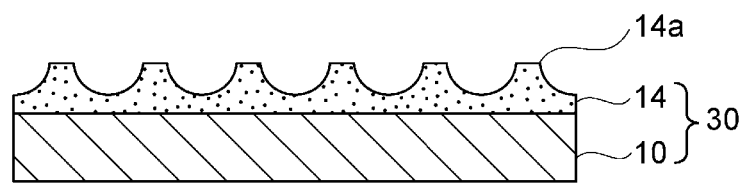
FIGS. 7A-7D are figures offering to describe the substrate (the electrode component) which was obtained by the irregular-surface forming method of the present invention.
Figure 7B:
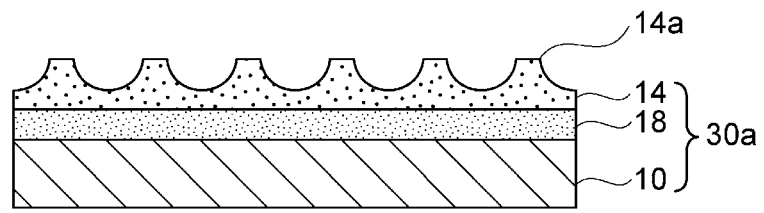
Figure 7C:
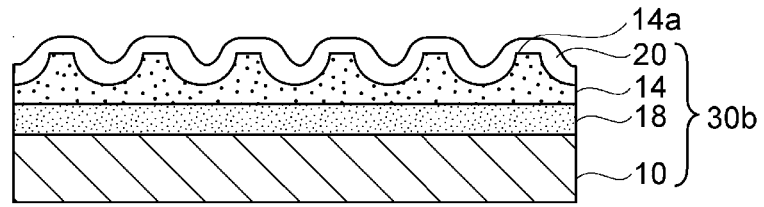
Figure 7D:
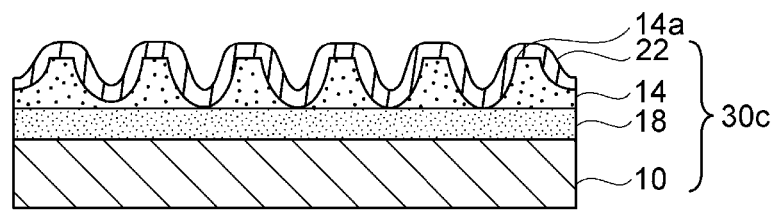

Note that it is also preferred to provide the primer layer 18 from the viewpoint of improving adhesion, for example, between the base 10 such as a glass plate and substrate 14 having the irregular-surface, as shown in FIG. 7B to 7D.

As for the material comprising the primer layer, although it is not limited in particular, but at least one kind of following resins could be used, which is selected from among, for example, an acrylic resin or its derivative, an epoxy resin or its derivative, a polyester resin or its derivative, a polyamide resin or its derivative, an urethane resin or its derivative, a phenolic resin or its derivative, a fluorine resin or its derivative, a silicone resin or its derivative, an ethylene-vinyl alcohol polymer or its derivative, an acrylonitrile-butadiene resin or its derivative (for example ABS system resin or its derivative), and a vinyl chloride vinyl acetate polymer or its derivative.

Also, as for the thickness of such primer layer, although it is not limited in particular, but it is preferred that the thickness is generally a value within the range of 0.1 to 1000 μm.

2. Conductive Layer

It is preferred to provide the predetermined conductive layer 20 on the substrate 14 having the irregular-surface 14a within the electrode component 30b as shown in FIG. 7C.

That is, if the substrate is made from electrically conducting material, a conductive layer is not necessarily required, however, if the substrate is made from non-electrically conducting material, it is preferred to provide a conductive layer including the metal or metal oxide on the surface of the substrate in order to effectively exert functions as an electrode component.

As a kind of metal to form the conductive layer, among such a metal as platinum, gold, silver, copper, nickel, molybdenum, aluminum, tungsten, or chromium, or an alloy of these metal or the like, only one kind alone or a combination of two kinds or more could be used.

As the kind of metal oxide to form the conductive layer, among tin dope oxidization indium (ITO), zinc dope oxidization indium (IZO), oxidization indium, tin oxide, zinc oxide and the like, only one kind alone or a combination of two kinds or more could be used.

It is preferred that the thickness of the conductive layer is generally a value within the range of 50 to 1000 nm.

This is because if the thickness of the conductive layer is below 50 nm, there are cases that its functional strength becomes deteriorated, durability and adhesion significantly decline, and a surface resistivity of the electrode component becomes excessively large.

On the other hand, this is because when the thickness of the conductive layer is over 1000 nm, there are cases that it takes an excessively long time to form the conductive layer and adhesion to the substrate significantly decreases.

Therefore, it is more preferred that the thickness of the conductive layer is set to be a value within the range of 50 to 800 nm, and much more preferred that the thickness of the metal oxide film is set to be a value within the range of 100 to 600 nm.

3. Surface Resistivity

Also, as for the electrode components 30, 30a, 30b and 30c shown in FIGS. 7A to 7D, the surface resistivity of the substrate 14 (In case the substrate is composed of an electrically conducting material, it is the substrate itself, and in case the substrate includes the conductive layer, it is the conductive layer) having the irregular-surface 14a is set to be a value within $1 \times 10^0$ to $1 \times 10^{10}$ $\Omega/\square$.

This is because, if the surface resistivity of the substrate is over $1 \times 10^{10} \Omega/\square$, there are cases that conductivity significantly decreases and available applications may be excessively limited.

On the other hand, there are cases that it is difficult to stably form the conductive layer which surface resistivity of the substrate is below $1 \times 10^0 \Omega/\square$.

Therefore, it is more preferred that the surface resistivity of the substrate is set to be a value within the range of $3 \times 10^0$ to $1 \times 10^9 \Omega/\square$, and much more preferred that the surface resistivity is set to be a value within the range of $5 \times 10^0$ to $1 \times 10^8 \Omega/\square$.

Note that a method of measuring the surface resistivity of the substrate of the electrode component will be described in detail in examples mentioned later.

4. Protective Layer

Also, it is also preferred that a protective layer 22 could be formed above the substrate 14 having the irregular-surface 14a of the electrode component as shown in FIG. 7D.

For example, when the electrode component has such a protective layer, damages to the conductive layer could be prevented.

Note that as materials comprising the protective layer, for example, a thermosetting resin, a photopolymer or a thermoplastic resin could be used.

5. Patterning

Also, it is preferred to form a predetermined pattern to the substrate having the irregular-surface although there are no figures to show it.

This is because the substrate carried out such a patterning could be suitably used as an electrode of a liquid crystal display device, a plasma display device, an organic electroluminescence device or an inorganic electroluminescence device.

6. Applications (Usage)

Also, as for applications for forming the electrode component, an electronic device would be preferred.

This is because since the electrode component of the present invention has a low surface resistivity and predetermined irregular-surface, an electronic device could be effectively driven when it is configured as an electrode for an electronic device.

Particularly, when the electrode component is used as an electrode for solar batteries of an electronic device, conversion efficiency could increase because contact areas with an adjacent semiconductor layer increases.

Note that electronic devices include a liquid crystal display device, an organic electroluminescence device, an organic thin film solar cell, a sensitization type solar cell, an organic transistor, a plasma display, and the like.

EXAMPLE

Example 1

1. Forming of Metal Oxide Film (1) First Process

Firstly, water solution (concentration 5 g/water 19 g) of polyvinyl alcohol (Gohsenol EG-05T made by the Nippon Synthetic Chemical Industry Co., Ltd) was coated to a surface of glass plate of 700 μm in thickness (EAGLE 2000, made by Corning Incorporated) as a base of the substrate, by a spin-coating method (rotation speed 1500 rpm), and then it was dried at 100° C. for 5 minutes. Thereby, a polyvinyl alcohol layer of 1000 nm in thickness was formed, and thus the substrate was obtained.

Also, 1.0 g of zinc acetate (made by Aldrich, purity 99.99%) as the metal salt and 10 ml of pure water were poured into a container having a stirring device, and they were stirred until uniform and set to be the liquid material containing the metal salt (concentration is 0.54 mol/L).

Next, the obtained liquid material containing the metal salt was coated to the polyvinyl alcohol layer by a spin-coating method (rotation speed 1500 rpm). Thus, the metal salt film was obtained.

(2) Second Process

Next, the metal salt film was dried at 100° C. for 5 minutes, and thus obtained a resist which had 2.112 nm of Ra and 10.22 nm of Rz as to surface roughness, and which is a partially oxidized zinc acetate film (conversion: 21.8%) of 100 nm in thickness.

The change of quantity is obtained by calculating a change of quantity of carbon (=(A−B)/A×100), as mentioned above, where A is an element quantity of carbon in the metal salt film before the partial oxidization and B is an element quantity of carbon in the metal salt film after the partial oxidization measured by XPS.

(3) Third Process

Next, the plasma-etching process was carried out to the polyvinyl alcohol layer with the resist comprising partially oxidized zinc acetate film, by using the plasma device (PDC-210, made by Yamato Material Co. Ltd.) under the following conditions.

| | |
|---|---|
| RF electric power (frequency 13.56 MHz) | 300 W |
| Plasma generation gas | Ar |
| Gas flow rate | 50 mL/min. |
| Plasma pressure | 45 Pa |
| Plasma process time | 1 min. |
| Plasma process temperature | 45° C. |

2. Evaluation of the Substrate Surface

The surface (the surface of the substrate), on which the plasma-etching process was carried out, was evaluated by the following items. Table 1 shows the experimental results.

Figure 8A:
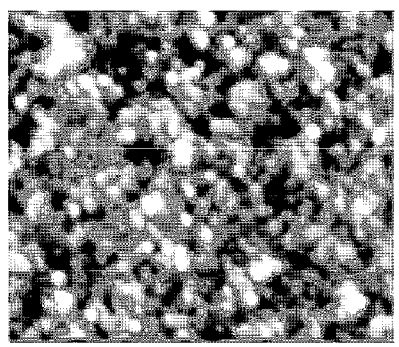
FIGS. 8A-8B are figures (photographs by atomic force microscope photographs) showing the condition of the surface or the cross section of the substrate before the plasma-etching process in the example 1.
Figure 8B:
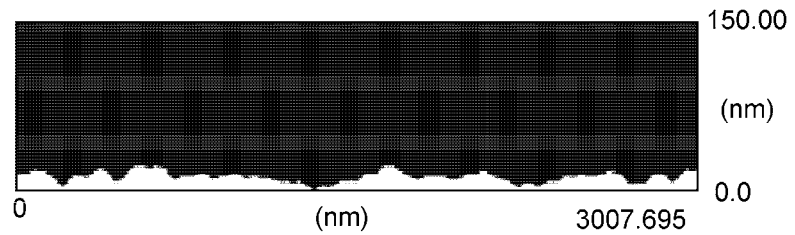

Also, microphotographs (photographed area: around 3 mm by 3 mm) demonstrating the condition of the surface or the cross section before the plasma-etching process in the example 1 are shown in FIGS. 8A to 8B.

(1) The Center Line Average Surface Roughness (Ra)

The center line average surface roughness (Ra) was measured by using an atomic force microscope (SPA300HV made by SII NanoTechnology Inc.).

That is, the surface (measuring area: 5 μm×5 μm) was observed using an atomic force microscope with DFM mode (dynamic force mode) and with the scan frequency of 0.3 Hz. Then, the center line average roughness (Ra) was calculated by applying the above measurement data to formula (1) mentioned above.

(2) The Ten-Point Average Roughness (Rz)

Also, the ten-point average roughness (Rz) was measured by using the above mentioned atomic force microscope, in accordance with JIS B0601-1994.

(3) Oxygen Content

An elementary analysis of the substrate surface was carried out under the following conditions by using an X-rays photoelectron spectroscopic analysis (an XPS analysis using Quantera SXM made by ULVAC-PHI, Incorporated). Thus, the metal element content, an oxygen content and a carbon content (mol %) were measured respectively.

| Exciting X rays | Ar |
| --- | --- |
| X-ray size | 100 μm |
| X-ray output | 15 kV, 25 W |
| Photoelectron escape angle | 45 degrees |

Example 2

In example 2, the resist formed by comprising the partially oxidized zinc acetate (conversion: 23.4%) was formed, then the plasma-etching process was carried out to the polyvinyl alcohol layer or the like, in the same way as example 1, except that the plasma process time was set to be 3 minutes and the plasma process temperature was set to be 55° C. in the third process. Next, the surface roughness and the elementary analysis or the like of the surface were examined in the same way as example 1. Table 1 shows the experimental results.

Example 3

In example 3, the resist comprising the partially oxidized zinc acetate (conversion: 21.4%) was formed, then the plasma-etching process was carried out to the polyvinyl alcohol layer or the like, in the same way as example 1, except that the plasma process time was set to be 5 minutes and the plasma process temperature was set to be 75° C. in the third process. Next, the surface roughness and the elementary analysis or the like of the surface were examined in the same way as example 1. Table 1 shows the experimental results.

It is understood by the evaluation results of the examples 1 to 3 in the table 1 that it was enabled to form larger irregular-surface on the substrate, owing to the predetermined surface roughness by the drying process in the second process, respectively, and then carrying out the predetermined plasma-etching process in the third process.

Also, it was enabled to precisely form the irregular-surface on the substrate within the predetermined range (Ra is from 2.3 to 10.2 nm and Rz is from 10.1 to 56.7 nm), owing to changing the process time for the plasma-etching process in the third process.

Example 4

1. Forming the Metal Salt Film (1) The First Process

First of all, a water solution (concentration 5 g/water 19 g) of polyvinyl alcohol (Gohsenol EG-05T made by the Nippon Synthetic Chemical Industry Co., Ltd) was coated to a surface of glass plate of 700 μm in thickness (EAGLE 2000, made by Corning Incorporated), by a spin-coating method (rotation speed 1500 rpm), and then it was dried at 100° C. for 5 minutes. Thus, a polyvinyl alcohol layer of 1000 nm in thickness was formed.

Also, 1.0 g (5.4 mmol) of zinc acetate (made by Aldrich, purity 99.99%) as the metal salt and 10 ml of pure water were poured into a container having a stirring device, and they were stirred until uniform and set to be the liquid material containing the metal salt (concentration is 0.54 mol/L).

Next, the obtained liquid material containing the metal salt was coated on the polyvinyl alcohol layer by a spin-coating method (rotation speed 1500 rpm).

(2) The Second Process-1

Next, the metal salt film was dried at 100° C. for 5 minutes, and thus obtained a partially oxidized zinc acetate film (conversion: 21.8%) of 100 nm in thickness, which had 2.112 nm of Ra and 10.22 nm of Rz with respect to the surface roughness (3) The Second Process-2

Next, the thermal oxidization process was carried out at 150° C. for 60 minutes under oxygen atmosphere, and thus the resist comprising the further partially oxidized zinc acetate film (conversion: 46.8%) was obtained, which had 2.115 nm of Ra and 10.21 nm of Rz with respect to the surface roughness.

(4) The Third Process

Next, the plasma-etching process was carried out to the polyvinyl alcohol layer with the resist comprising partially oxidized zinc acetate layer, by using the plasma device (PDC-210, made by Yamato Material Co. Ltd.), under the following conditions.

TABLE 1

|  | Second process (Drying process) | | Third process (Plasma etching process) | | | | XPS element analysis | | |
| --- | --- | --- | --- | --- | --- | --- | --- | --- | --- |
|  | Ra (nm) | Rz (nm) | Time (min) | Temperature (° C.) | Ra (nm) | Rz (nm) | Metal (mol %) | Oxygen (mol %) | Carbon (mol %) |
| Example 1 | 2.112 | 10.22 | 1 | 45 | 2.345 | 10.13 | 9.2 | 36.8 | 54.0 |
| Example 2 | 2.232 | 10.31 | 3 | 55 | 6.321 | 26.33 | 0.2 | 20.1 | 79.9 |
| Example 3 | 2.098 | 10.12 | 5 | 75 | 10.22 | 56.71 | 0.3 | 20.0 | 79.7 |

| RF electric power (frequency 13.56 MHz) | 300 W |
| --- | --- |
| Plasma generation gas | Ar |
| Gas flow rate | 50 mL/min. |
| Plasma pressure | 45 Pa |
| Plasma process time | 1 min. |
| Plasma process temperature | 45° C. |

2. Evaluation of the Substrate Surface

The surface roughness and the elementary analysis or the like of the surface were examined, as to the surface of the obtained polyvinyl alcohol layer, in the same way as example 1. Table 1 shows the experimental results.

Example 5

In example 5, the resist comprising the partially oxidized zinc acetate (conversion: 45.5%) was formed, then the plasma-etching process was carried out to the polyvinyl alcohol layer or the like, in the same way as example 4, except that the plasma process time was set to be 3 minutes and the plasma process temperature was set to be 55° C. in the third process. Next, the surface roughness and the elementary analysis or the like of the surface were examined in the same way as example 4. Table 2 shows the experimental results.

Example 6

In example 6, the resist comprising the partially oxidized zinc acetate (conversion: 42.5%) was formed, then the plasma-etching process was carried out to the polyvinyl alcohol layer or the like, in the same way as example 4, except that the plasma process time was set to be 5 minutes and the plasma process temperature was set to be 75° C. in the third process. Next, the surface roughness and the elementary analysis or the like of the surface were examined in the same way as example 4. Table 2 shows the experimental results.

Example 7

In example 7, the resist comprising the partially oxidized zinc acetate (conversion: 35.0%) was formed, then the plasma-etching process was carried out to the polyvinyl alcohol layer or the like, in the same way as example 4, except that the partially oxidized zinc acetate was obtained by the following plasma process instead of the thermal oxidization process in the second-2 process. Next, the surface roughness and the elementary analysis or the like of the surface were examined in the same way as example 4. Table 3 shows the experimental results.

Figure 9A:
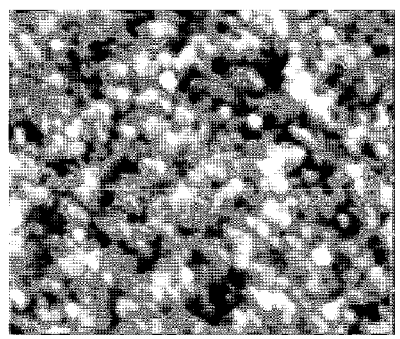
FIGS. 9A-9B are figures (photographs by atomic force microscope photographs) showing the condition of the surface or the cross section of the substrate after the plasma-etching process in the example 7.
Figure 9B:
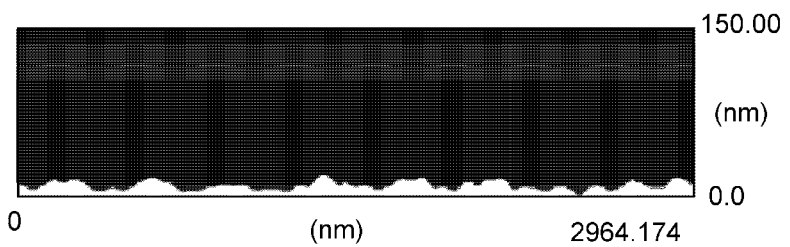

Also, microphotographs (photographed area: around 3 mm by 3 mm) demonstrating the condition of the surface or the cross section of the substrate after the plasma-etching process in example 7 are shown in FIGS. 9A to 9B for reference purposes.

| RF electric power (frequency 13.56 MHz) | 300 W |
| --- | --- |
| Plasma generation gas | O2 |
| Gas flow rate | 50 mL/min. |
| Plasma pressure | 45 Pa |
| Plasma process time | 1 min. |
| Plasma process temperature | 45° C. |

Example 8

In example 8, the resist comprising the partially oxidized zinc acetate (conversion: 35.7%) was formed, then the plasma-etching process was carried out to the polyvinyl alcohol layer or the like, in the same way as example 7, except that the plasma process time was set to be 3 minutes and the plasma process temperature was set to be 55° C. in the third process. Next, the surface roughness and the elementary analysis or the like of the surface were examined in the same way as example 7. Table 3 shows the experimental results.

TABLE 2

| | Second process (Drying process and thermal oxidation process) | | Third process (Plasma etching process) | | | | XPS element analysis | | |
| --- | --- | --- | --- | --- | --- | --- | --- | --- | --- |
| | Ra (nm) | Rz (nm) | Time (min) | Temperature (° C.) | Ra (nm) | Rz (nm) | Metal (mol %) | Oxygen (mol %) | Carbon (mol %) |
| Example 4 | 2.115 | 10.21 | 1 | 45 | 6.489 | 27.90 | 32.7 | 48.1 | 19.2 |
| Example 5 | 2.222 | 10.41 | 3 | 55 | 20.17 | 118.7 | 9.3 | 31.9 | 58.8 |
| Example 6 | 2.211 | 10.39 | 5 | 75 | 28.32 | 154.1 | 0.4 | 21.9 | 77.7 |

It is understood by the evaluation results of the examples 4 to 6 in the table 2 that it was enabled to form surface roughness which is larger than example 1 or the like on the substrate, owing to carrying out the drying process and the thermal oxidization process in the second process, and then carrying out the predetermined plasma-etching process in the third process.

Also, it was similarly enabled in examples 4 through 6 to precisely form the surface roughness on the substrate within the predetermined range (Ra is from 6.5 to 28.3 nm and Rz is from 27.9 to 154.1 nm), owing to changing the plasma process time in the third process.

Figure 10A:
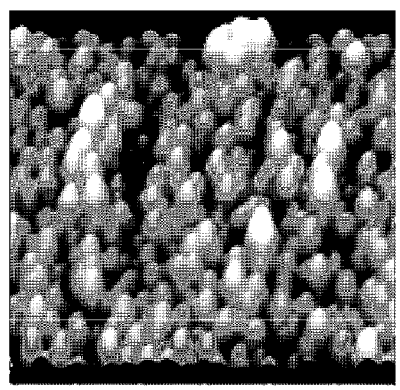
FIGS. 10A-10B are figures (photographs by atomic force microscope photographs) showing the condition of the surface or the cross section of the substrate after the plasma-etching process in the example 8.
Figure 10B:
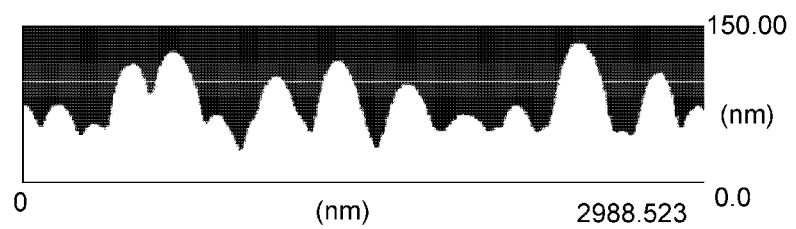

Also, microphotographs (photographed area: around 3 mm by 3 mm) demonstrating the condition of the surface or the cross section of the substrate after the plasma-etching process in example 8 are shown in FIGS. 10A to 10B for reference purposes.

Example 9

In example 9, the resist comprising the partially oxidized zinc acetate (conversion: 34.1%) was formed, then the plasma-etching process was carried out to the polyvinyl alcohol layer or the like, in the same way as example 7, except that the plasma process time was set to be 5 minutes and the plasma process temperature was set to be 75° C. in the third process. Next, the surface roughness and the elementary analysis or the like of the surface were examined in the same way as example 7. Table 3 shows the experimental results.

Figure 11A:
FIGS. 11A-11B are figures (photographs by atomic force microscope photographs) showing the condition of the surface or the cross section of the substrate after the plasma-etching process in the example 9.
Figure 11B:
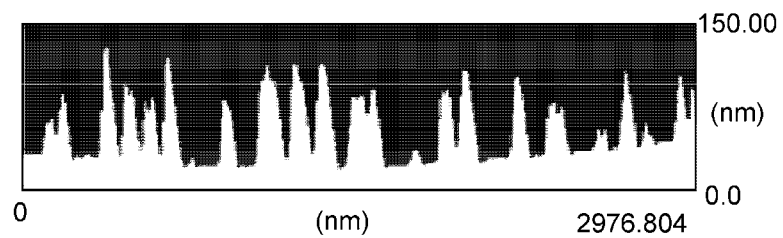
Figure 12A:
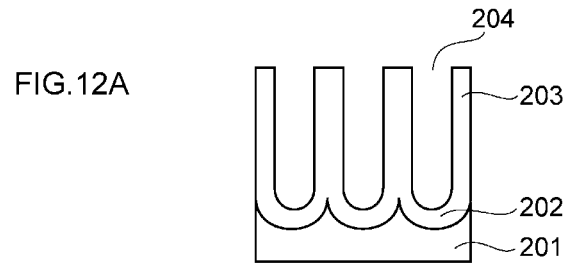
FIGS. 12A-12F are figures offering to describe a conventional method for manufacturing a porous material.
Figure 12B:
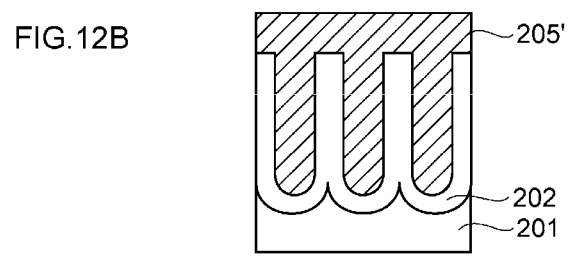
Figure 12C:
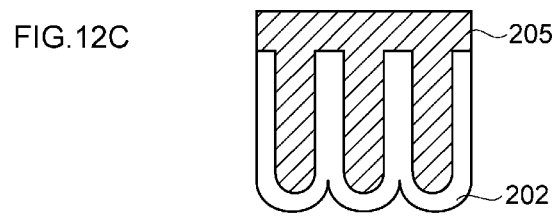
Figure 12D:
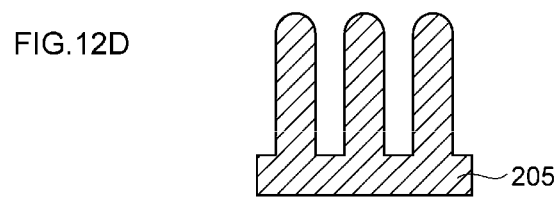
Figure 12E:
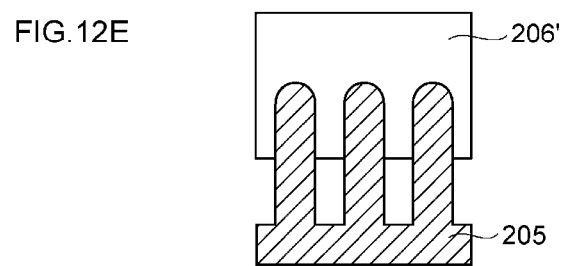
Figure 12F:
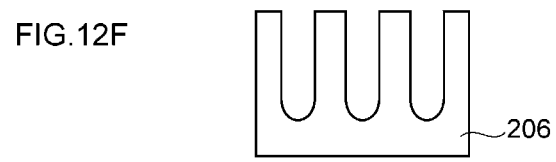

Also, microphotographs (photographed area: around 3 mm by 3 mm) demonstrating the condition of the surface or the cross section of the substrate after the plasma-etching process in example 9 are shown in FIGS. 11A to 11B for reference purposes.

TABLE 3

| | Second process (Drying process and plasma oxidation process) | | Third process (Plasma etching process) | | | | XPS element analysis | | |
|---|---|---|---|---|---|---|---|---|---|
| | Ra (nm) | Rz (nm) | Time (min) | Temperature (° C.) | Ra (nm) | Rz (nm) | Metal (mol %) | Oxygen (mol %) | Carbon (mol %) |
| Example 7 | 2.101 | 10.19 | 1 | 45 | 5.228 | 27.89 | 31.2 | 47.8 | 21.0 |
| Example 8 | 2.277 | 10.43 | 3 | 55 | 21.021 | 120.35 | 8.9 | 30.1 | 61.0 |
| Example 9 | 2.201 | 10.41 | 5 | 75 | 27.348 | 161.22 | 0.4 | 22.0 | 77.6 |

It is understood by the evaluation results of the examples 7 to 9 in the table 3 that it was enabled to form irregularities larger than example 1 or the like on the substrate, owing to carrying out the drying process and the plasma oxidization process in the second process, and then carrying out the predetermined plasma-etching process in the third process.

Also, it was similarly enabled in examples 7 through 9 to precisely form the surface roughness on the substrate within the predetermined range (Ra is from 5.2 to 27.3 nm and Rz is from 27.9 to 161.2 nm), owing to changing the plasma process time in the third process.

Example 10

In example 10, the resist comprising the partially oxidized silver acetate (conversion: 29.8%) was formed, then the plasma-etching process was carried out to the polyvinyl alcohol layer or the like, under the same conditions as example 9, except that silver acetate (made by Aldrich, purity 99.99%) was used as a salt metal, and 0.9 g of the silver acetate (5.4 mmol) and 10 ml of pure water were poured into a container having a stirring device, and then they were stirred until uniform and set to be the liquid material containing silver acetate (concentration is 0.54 mol/L). Next, the surface roughness and the elementary analysis or the like of the surface were examined in the same way with example 9. Table 4 shows the experimental results.

Example 11

In example 11, the resist comprising the partially oxidized copper acetate film (conversion: 41.6%) was formed, then the plasma-etching process was carried out to the polyvinyl alcohol layer or the like, under the same conditions as example 9, except that copper acetate (made by Aldrich, purity 99.99%) was used as a salt metal, and 0.98 g of the copper acetate (5.4 mmol) and 10 ml of pure water were poured into a container having a stirring device, and then they were stirred until uniform and set to be the liquid material containing copper acetate (concentration is 0.54 mol/L). Next, the surface roughness and the elementary analysis or the like of the surface were examined in the same way with example 9. Table 4 shows the experimental results.

Example 12

In example 12, the resist comprising the partially oxidized cadmium acetylacetonate film (CdAcAc, conversion: 25.8%) was formed, then the plasma-etching process was carried out to the polyvinyl alcohol layer or the like, under the same conditions as example 9, except that cadmium acetylacetonate (made by Aldrich, purity 99.99%) was used as a salt metal, and 1.68 g of the cadmium acetylacetonate (5.4 mmol) and 10 ml of ethanol were poured into a container having a stirring device, and then they were stirred until uniform and set to be the liquid material containing cadmium acetylacetonate (concentration is 0.54 mol/L). Next, the surface roughness and the elementary analysis or the like of the surface were examined in the same way as example 9. Table 4 shows the experimental results.

Example 13

In example 13, the resist comprising the partially oxidized lead acetate film (conversion: 32.0%) was formed, then the plasma-etching process was carried out to the polyvinyl alcohol layer or the like, under the same conditions as example 9, except that lead acetate (made by Aldrich, purity 99.99%) was used as a salt metal, and 2.39 g of the lead acetate (5.4 mmol) and 10 ml of pure water were poured into a container having a stirring device, and then they were stirred until uniform and set to be the liquid material containing lead acetate (concentration is 0.54 mol/L). Next, the surface roughness and the elementary analysis or the like of the surface were examined in the same way as example 9. Table 4 shows the experimental results.

Example 14

In example 14, the resist comprising the partially oxidized gallium acetylacetonate film (GaAcAc, conversion: 26.0%) was formed, then the plasma-etching process was carried out to the polyvinyl alcohol layer or the like, and then the surface roughness and the elementary analysis or the like of the surface were examined, under the same conditions as example 9, except that gallium acetylacetonate (made by Aldrich, purity 99.99%) was used as a salt metal, and 1.98 g of the cadmium acetylacetonate (5.4 mmol) and 10 ml of ethanol were poured into a container having a stirring device, and then they were stirred until uniform and set to be the liquid material containing gallium acetylacetonate (concentration is 0.54 mol/L). Table 4 shows the experimental results.

Example 15

In example 15, the resist comprising the partially oxidized indium acetylacetonate film (InAcAc, conversion: 30.2%) was formed, then the plasma-etching process was carried out to the polyvinyl alcohol layer or the like, under the same conditions as example 9, except that indium acetylacetonate (made by Aldrich, purity 99.99%) was used as a salt metal (metal complex) and 2.23 g of the indium acetylacetonate (5.4 mmol) and 10 ml of ethanol were poured into a container having a stirring device, and then they were stirred until uniform and set to be the liquid material containing indium acetylacetonate (concentration is 0.54 mol/L). Next, the surface roughness and the elementary analysis or the like of the surface were examined in the same way as example 9. Table 4 shows the experimental results.

Example 16

In example 16, the resist comprising the partially oxidized thallium acetate film (conversion: 33.2%) was formed, then the plasma-etching process was carried out to the polyvinyl alcohol layer or the like, under the same conditions as example 9, except that thallium acetate (made by Aldrich, purity 99.99%) was used as a salt metal, and 1.42 g of the thallium acetate (5.4 mmol) and 10 ml of pure water were poured into a container having a stirring device, and then they were stirred until uniform and set to be the liquid material containing thallium acetate (concentration is 0.54 mol/L). Next, the surface roughness and the elementary analysis or the like of the surface were examined in the same way as example 9. Table 4 shows the experimental results.

Example 17

In example 17, the resist comprising the partially oxidized mercury acetate film (conversion: 27.3%) was formed, then the plasma-etching process was carried out to the polyvinyl alcohol layer or the like, under the same conditions as example 9, except that mercury acetate (made by Aldrich, purity 99.99%) was used as a salt metal, and 1.72 g of the mercury acetate (5.4 mmol) and 10 ml of pure water were poured into a container having a stirring device, and then they were stirred until uniform and set to be the liquid material containing mercury acetate (concentration is 0.54 mol/L). Next, the surface roughness and the elementary analysis or the like of the surface were examined in the same way as example 9. Table 4 shows the experimental results.

Example 18

In example 18, the resist comprising the partially oxidized manganese acetate film (conversion: 36.4%) was formed, then the plasma-etching process was carried out to the polyvinyl alcohol layer or the like, under the same conditions as example 9, except that manganese acetate (made by Aldrich, purity 99.99%) was used as a salt metal, and 0.93 g of the manganese acetate (5.4 mmol) and 10 ml of pure water were poured into a container having a stirring device, and then they were stirred until uniform and set to be the liquid material containing manganese acetate (concentration is 0.54 mol/L). Next, the surface roughness and the elementary analysis or the like of the surface were examined in the same way as example 9. Table 4 shows the experimental results.

Example 19

In example 19, the resist comprising the partially oxidized nickel acetylacetonate film (NiAcAc, conversion: 22.2%) was formed, then the plasma-etching process was carried out to the polyvinyl alcohol layer or the like, under the same conditions as example 9, except that nickel acetylacetonate (made by Aldrich, purity 99.99%) was used as a salt metal (metal complex), and 1.39 g of the nickel acetylacetonate (5.4 mmol) and 10 ml of ethanol were poured into a container having a stirring device, and then they were stirred until uniform and set to be the liquid material containing nickel acetylacetonate (concentration is 0.54 mol/L). Next, the surface roughness and the elementary analysis or the like of the surface were examined in the same way as example 9. Table 4 shows the experimental results.

Example 20

In example 20, the resist comprising the partially oxidized molybdenum acetate film (conversion: 38.6%) was formed, then the plasma-etching process was carried out to the polyvinyl alcohol layer or the like, under the same conditions as example 9, except that molybdenum acetate (made by Aldrich, purity 99.99%) was used as a salt metal, and 2.31 g of the molybdenum acetate (5.4 mmol) and 10 ml of pure water were poured into a container having a stirring device, and then they were stirred until uniform and set to be the liquid material containing molybdenum acetate (concentration is 0.54 mol/L). Next, the surface roughness and the elementary analysis or the like of the surface were examined in the same way as example 9. Table 4 shows the experimental results.

Example 21

In example 21, the resist comprising the partially oxidized palladium acetylacetonate film (PdAcAc, conversion: 27.4%) was formed, then the plasma-etching process was carried out to the polyvinyl alcohol layer or the like, under the same conditions as example 9, except that palladium acetylacetonate (made by Aldrich, purity 99.99%) was used as a salt metal (metal complex), and 1.65 g of the palladium acetylacetonate (5.4 mmol) and 10 ml of ethanol were poured into a container having a stirring device, and then they were stirred until uniform and set to be the liquid material containing palladium acetylacetonate (concentration is 0.54 mol/L). Next, the surface roughness and the elementary analysis or the like of the surface were examined as the same way as example 4. Table 4 shows the experimental results.

TABLE 4

| | | Second process (Drying process and plasma oxidation process) | | Third process (Plasma etching process) | | XPS element analysis | | |
|---|---|---|---|---|---|---|---|---|
| | Metal salt | Ra (nm) | Rz (nm) | Ra (nm) | Rz (nm) | Metal (mol %) | Oxygen (mol %) | Carbon (mol %) |
| Example 10 | Silver acetate | 2.512 | 11.34 | 27.860 | 153.11 | 0.3 | 21.1 | 78.6 |
| Example 11 | Copper acetate | 2.419 | 11.12 | 25.160 | 150.01 | 0.4 | 21.4 | 78.2 |
| Example 12 | CdAcAc | 2.754 | 14.68 | 29.440 | 155.19 | 0.2 | 20.1 | 79.7 |
| Example 13 | Lead acetate | 2.665 | 13.55 | 28.630 | 153.27 | 0.2 | 20.7 | 79.1 |

TABLE 4-continued

|  | Metal salt | Second process (Drying process and plasma oxidation process) | | Third process (Plasma etching process) | | XPS element analysis | | |
|---|---|---|---|---|---|---|---|---|
|  |  | Ra (nm) | Rz (nm) | Ra (nm) | Rz (nm) | Metal (mol %) | Oxygen (mol %) | Carbon (mol %) |
| Example 14 | GaAcAc | 3.129 | 17.39 | 27.190 | 153.22 | 0.3 | 21.5 | 78.2 |
| Example 15 | InAcAc | 2.166 | 10.54 | 27.320 | 154.02 | 0.2 | 21.6 | 78.2 |
| Example 16 | Thallium acetate | 2.096 | 10.23 | 25.440 | 149.44 | 0.4 | 21.8 | 77.8 |
| Example 17 | Mercury acetate | 3.356 | 19.54 | 24.770 | 148.38 | 0.3 | 20.6 | 79.1 |
| Example 18 | Manganese acetate | 2.854 | 18.22 | 27.180 | 150.92 | 0.2 | 20.9 | 78.9 |
| Example 19 | NiAcAc | 2.130 | 11.04 | 23.980 | 148.41 | 0.4 | 21.5 | 78.1 |
| Example 20 | Molybdenum acetate | 2.668 | 13.04 | 27.550 | 154.26 | 0.3 | 20.1 | 79.6 |
| Example 21 | PdAcAc | 2.467 | 10.95 | 28.160 | 152.13 | 0.2 | 20.2 | 79.6 |

As it is understood from the evaluation results in examples 10 through 21 shown in table 4, it is proved to precisely form the irregular-surface on the substrate within the predetermined range, owing to changing the kind of metal salt.

In example 22, the resist comprising the partially oxidized zinc oxide film (conversion: 36.8%) was formed, then the plasma-etching process was carried out to the polyvinyl alcohol layer or the like, under the same conditions as example 9, except that polyethylene-telephthalate (PET) film of 188 μm in thickness (A-4300, made by Toyobo Co., Ltd.) was used instead of the glass plate of the predetermined thickness as a base of the substrate. Next, the surface roughness and the elementary analysis or the like of the surface were examined in the same way as example 9. Table 5 shows the experimental results.

It is understood that even though the base of the substrate was the PET film, the predetermined surface roughness were stably and precisely formed on the polyvinyl alcohol layer as the resin layer of the substrate.

Example 23

In example 23, the resist comprising the partially oxidized zinc acetate film (conversion: 35.5%) was formed, then the plasma-etching process was carried out to the PEDOT:PSS layer or the like, under the same conditions as example 9, except that ITO glass (the surface resistivity is 7Ω/□, made by Nippon Sheet Glass Co., Ltd.) was used instead of the glass plate of the predetermined thickness as a base of the substrate, and also PEDOT:PSS (Baytron P, made by Bayer) of conducting polymer was used instead of the polyvinyl alcohol layer of the predetermined thickness, and the coating was carried out to the substrate by the spin-coating method, and then it was dried at 150° C. for 60 minutes, and thus the PEDOT:PSS film of 1000 nm in thickness was formed. Next, the surface roughness and the elementary analysis or the like of the surface were examined in the same way as example 9. Table 5 shows the experimental results.

When surface resistivity of the obtained PEDOT:PSS film after the plasma-etching process was measured by a surface resistance meter (Loresta-GP, made by Mitsubishi chemical analytech Co., Ltd.), the surface resistivity was 8.213 Ω/□.

It is understood that even though the base of the substrate was the ITO glass, the predetermined surface roughness were stably and precisely formed on the PEDOT:PSS layer as the resin layer of the substrate.

Example 24

In example 24, the resist comprising the partially oxidized zinc oxide film (conversion: 32.5%) was formed, then the plasma-etching process was carried out to the polyaniline layer or the like, under the same conditions as example 9, except that ITO glass (the surface resistivity is 7Ω/□, made by Nippon Sheet Glass Co., Ltd.) was used instead of the glass plate of the predetermined thickness as a base of the substrate, and also polyaniline film (NX-D103X, made by Nissan Chemical Industries, Ltd.) of conducting polymer was used instead of the polyvinyl alcohol layer of the predetermined thickness, and the coating was carried out to the substrate by the spin-coating method, and then it was dried at 150° C. for 60 minutes, and thus the polyaniline film of 1000 nm in thickness was formed. Next, the surface roughness and the elementary analysis or the like of the surface were examined in the same way as example 9. Table 5 shows the experimental results.

When surface resistivity of the obtained polyaniline after the plasma-etching process was measured by a surface resistance meter in the same way as example 23, the surface resistivity was 7.413 Ω/□.

It is understood that even though the base of the substrate was the ITO glass, the predetermined surface roughness were stably and precisely formed on the polyaniline layer as the resin layer of the substrate.

TABLE 5

| | Substrate | | Second process (Drying process and plasma oxidation process) | | Third process (Plasma etching process) | | XPS element analysis | | |
|---|---|---|---|---|---|---|---|---|---|
| | | | Ra | Rz | Ra | Rz | Metal | Oxygen | Carbon |
| | Kind | Resin | (nm) | (nm) | (nm) | (nm) | (mol %) | (mol %) | (mol %) |
| Example 22 | PET | PVA | 2.219 | 10.32 | 28.160 | 153.11 | 0.4 | 21.8 | 77.8 |
| Example 23 | ITO | PEDOT/PSS | 2.118 | 10.45 | 27.320 | 152.39 | 0.3 | 21.1 | 78.6 |
| Example 24 | ITO | Polyaniline | 2.145 | 10.21 | 27.550 | 153.25 | 0.4 | 21.4 | 78.2 |

Example 25

In example 25, the substrate provided with the polyvinyl alcohol layer having the irregular-surface was formed, and the resist comprising the partially oxidized zinc oxide film (conversion: 36.6%) was formed, under the same conditions as example 9, except that helium was used as the plasma generation gas. Next, the surface was examined in the same way as example 9. Table 6 shows the experimental results.

Example 26

In example 26, the substrate provided with the polyvinyl alcohol layer having the irregular-surface was formed, and the resist comprising the partially oxidized zinc oxide film (conversion: 35.5%) was formed, under the same conditions as example 9, except that krypton was used as the plasma generation gas. Next, the surface was examined in the same way as example 9. Table 6 shows the experimental results.

Example 27

In example 27, the substrate provided with the polyvinyl alcohol layer having the irregular-surface was formed, and the resist comprising the partially oxidized zinc oxide film (conversion: 33.2%) was formed, under the same conditions as example 9, except that nitrogen was used as the plasma generation gas. Next, the surface was examined in the same way as example 9. Table 6 shows the experimental results.

Example 28

In example 28, the substrate provided with the polyvinyl alcohol layer having the irregular-surface was formed, and the resist comprising the partially oxidized zinc oxide film (conversion: 33.6%) was formed, under the same conditions as example 9, except that tetrafluoride methane was used as the plasma generation gas. Next, the surface was examined in the same way as example 9. Table 6 shows the experimental results.

TABLE 6

| | Second process (Drying process and plasma oxidation process) | | | Third process (Plasma etching process) | | XPS element analysis | | |
|---|---|---|---|---|---|---|---|---|
| | Ra (nm) | Rz (nm) | Gas | Ra (nm) | Rz (nm) | Metal (mol %) | Oxygen (mol %) | Carbon (mol %) |
| Example 25 | 2.812 | 10.67 | He | 20.390 | 112.84 | 1.3 | 27.8 | 70.9 |
| Example 26 | 2.331 | 10.43 | Kr | 29.920 | 179.82 | 0.1 | 18.2 | 81.7 |
| Example 27 | 2.205 | 10.22 | N | 28.420 | 152.39 | 0.3 | 22.3 | 77.4 |
| Example 28 | 2.183 | 10.54 | CF4 | 31.690 | 187.31 | 0.1 | 16.7 | 83.2 |

As it is understood from the evaluation results in examples 25 through 28 shown in table 6, it is also proved to precisely form the irregular-surface on the substrate within the predetermined range, owing to changing the kind of plasma gas in the third process.

Comparative Example 1

In comparative example 1, the plasma-etching process was carried out in the same was as example 1, except that zinc oxide film was formed by a magnetron sputtering method instead of the resist comprising the partially oxidized zinc acetate. Next, the surface roughness or the like were examined in the same way as example 1.

That is, first of all, water solution (concentration 5 g/water 19 g) of polyvinyl alcohol (Gohsenol EG-05T made by the Nippon Synthetic Chemical Industry Co., Ltd) was coated to a surface of glass plate of 700 μm in thickness (EAGLE 2000, made by Corning Incorporated), by the spin-coating method (rotation speed 1500 rpm), and then it was dried at 100° C. for 5 minutes. Thus, polyvinyl alcohol layer of 1000 nm in thickness was formed.

Next, a zinc oxide film of 100 nm in thickness was formed on the polyvinyl alcohol layer by a magnetron sputtering method device (i-sputter, made by ULVAC Incorporated) under the following conditions.

| Target | zinc oxide (made by Sumitomo Metal Mining Co., Ltd.) |
|---|---|
| DC | 500 W |
| Time for forming the film | 52 seconds |
| Used gas | Ar |
| Gas flow rate | 100 cc/min. |

Next, the plasma-etching process was carried out to the zinc oxide film and the polyvinyl alcohol layer by the plasma-etching device, and then the surface roughness were examined in the same way as example 1. Table 7 shows the experimental results.

Comparative Example 2

In comparative example 2, the plasma-etching process was carried out to the polyvinyl alcohol layer, in the same way as comparative example 1, except that forming of the zinc oxide film by the magnetron sputtering method was omitted. Next, the surface roughness were examined Table 7 shows the experimental results.

TABLE 7

| | Before the plasma process | | After the plasma process | |
|---|---|---|---|---|
| | Ra (nm) | Rz (nm) | Ra (nm) | Rz (nm) |
| Comparative example 1 | 0.812 | 1.12 | 0.822 | 1.03 |
| Comparative example 2 | 0.981 | 1.35 | 6.212 | 31.31 |

As it is understood by the evaluation results in comparative examples 1 through 2 shown in table 7, it is proved that only small surface roughness on the surface of substrate were obtained compared with the examples in the embodiment and irregular-surface could not be stably formed, when the zinc oxide film was formed by the magnetron sputtering method in comparative example 1 instead of the resist comprising partially oxidized zinc acetate.

Similarly, when omitted to form the zinc oxide film by the magnetron sputtering method in comparative example 2, it was unable to precisely form the irregular-surface on the substrate.

INDUSTRIAL APPLICATION

As described the above, according to the irregular-surface forming method of the present invention, the substrate having the predetermined surface roughness could be stably and precisely formed, by plasma-etching speed adjustment effect being exerted, owing to using the partially oxidized metal salt film having predetermined surface roughness as well as the resist (plasma-etching speed adjustment member) when the plasma-etching process is carried out.

Also, according the irregular-surface forming method of the present invention, even the electrode components or the like which is best fit to electrodes for electronic devices and which has a large area and the irregular-surface in the order of nanometer could be stably and precisely formed.

Consequently, the present invention enables to efficiently and economically provides the electrodes or the like which are suitable for solar batteries, liquid crystal display devices, plasma display devices, organic electro luminescence devices, inorganic electro luminescence devices or the like.

The invention claimed is:

1. An irregular-surface forming method using a plasma-etching process to form predetermined irregular-surface pattern on a substrate, the substrate being selected from an organic resin film, a resin layer on an organic resin film, and a resin layer on a base, the method comprising:
    (1) forming a metal salt film on the substrate by coating the substrate with a liquid material containing a metal salt;
    (2) forming a fine irregular-surface on the metal salt film having a center line average surface roughness that is set to a value within a range of 2 to 5 nm;
    (3) converting the metal salt film into a resist by partial oxidation; and
    (4) plasma-etching the substrate with the resist to form the predetermined irregular-surface pattern on the substrate.

2. The irregular-surface forming method using a plasma-etching process of claim 1, wherein the fine irregular-surface on the metal salt film is formed by at least one process selected from a plasma process, a heat and dry process, and a mechanical press process.

3. The irregular-surface forming method using a plasma-etching process of claim 1, wherein the step of converting the metal salt film into a resist by partial oxidization is carried out by a plasma process using oxygen as a plasma generation gas, or a thermal oxidization process at a temperature of 120 to 300° C.

4. The irregular-surface forming method using a plasma-etching process of claim 1, wherein the plasma-etching is carried out using at least one plasma generation gas selected from the group consisting of a rare gas, nitrogen, and methane tetrafluoride.

5. The irregular-surface forming method using a plasma-etching process of claim 1, wherein the resin of the substrate an electrically conducting polymer material.

6. The irregular-surface forming method using a plasma-etching process of claim 1, further comprising removing any of the resist remaining on the substrate after the plasma-etching the substrate that has the resist thereon.

7. The irregular-surface forming method using the plasma-etching process of claim 1, further comprising:
   providing the substrate.

8. The irregular-surface forming method using a plasma-etching process of claim 1, wherein the fine irregular-surface is formed on the metal salt film and then the metal salt film is converted into the resist.

9. The irregular-surface forming method using a plasma-etching process of claim 1, wherein the fine irregular-surface is formed on the metal salt film at the same time the metal salt film is converted into the resist.

* * * * *